(12) United States Patent
Peng et al.

(10) Patent No.: US 12,514,130 B2
(45) Date of Patent: Dec. 30, 2025

(54) MAGNETO-RESISTIVE RANDOM-ACCESS MEMORY (MRAM) DEVICES AND METHODS OF FORMING THE SAME

(71) Applicant: TAIWAN SEMICONDUCTOR MANUFACTURING COMPANY, LTD., Hsinchu (TW)

(72) Inventors: Hsuan-Yi Peng, Hsinchu (TW); Cherng-Yu Wang, Hsinchu (TW); Jen-Po Lin, Taipei (TW); Hsiao-Kuan Wei, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 676 days.

(21) Appl. No.: 17/838,235

(22) Filed: Jun. 12, 2022

(65) Prior Publication Data

US 2023/0403948 A1  Dec. 14, 2023

(51) Int. Cl.
*H10N 50/80* (2023.01)
*H01F 10/32* (2006.01)
*H10B 61/00* (2023.01)
*H10N 50/01* (2023.01)

(52) U.S. Cl.
CPC ......... *H10N 50/80* (2023.02); *H01F 10/3286* (2013.01); *H10B 61/00* (2023.02); *H10N 50/01* (2023.02); *H01F 10/3259* (2013.01); *H01F 10/3272* (2013.01)

(58) Field of Classification Search
CPC ........ H10N 50/80; H10N 50/01; H10B 61/00; H01F 10/3286; H01F 10/3259; H01F 10/3272
USPC .......................................................... 257/421
See application file for complete search history.

(56) References Cited

U.S. PATENT DOCUMENTS

| | | | |
|---|---|---|---|
| 10,665,773 B2 | 5/2020 | Iwata et al. | |
| 11,373,915 B2* | 6/2022 | Tang | H10B 61/00 |
| 11,563,054 B2* | 1/2023 | Houssameddine | H10B 61/00 |
| 2020/0111511 A1* | 4/2020 | Yang | H01L 21/76895 |
| 2020/0194311 A1* | 6/2020 | Tang | H10B 61/22 |
| 2020/0303452 A1* | 9/2020 | Houssameddine | H10N 50/01 |
| 2020/0403143 A1 | 12/2020 | Iwata et al. | |
| 2022/0190235 A1* | 6/2022 | van der Straten | H10B 61/00 |

FOREIGN PATENT DOCUMENTS

TW   I509853 B   11/2015

* cited by examiner

*Primary Examiner* — Jami Valentine Miller
(74) *Attorney, Agent, or Firm* — NZ Carr Law Office

(57) ABSTRACT

Embodiments of the present disclosure provide a magnetic tunnel junction (MTJ) structure for storing a data. In one embodiment, the MJT structure includes a first ferromagnetic layer, a second ferromagnetic layer disposed above the first ferromagnetic layer, a first dielectric layer disposed between and in contact with the first ferromagnetic layer and the second ferromagnetic layer, a plurality of metal particles disposed in contact with the second ferromagnetic layer, wherein the metal particles are distributed in a discrete and non-continuous manner, and a second dielectric layer disposed over the plurality of metal particles.

8 Claims, 26 Drawing Sheets

MAGNETO-RESISTIVE RANDOM-ACCESS MEMORY (MRAM) DEVICES AND METHODS OF FORMING THE SAME

BACKGROUND

Semiconductor memory devices are used in integrated circuits (ICs) to store digital data for electronic applications. One type of semiconductor memory device is the spin electronic device, which combines semiconductor technology with magnetic materials and devices. The spin, rather than the charge, of electrons is used to indicate a bit through their magnetic moments. One such spin electronic device is the magneto-resistive random-access memory (MRAM) device. MRAM devices are typically faster and have better endurance than current non-volatile memory, such as flash random access memory. Moreover, MRAM devices typically have similar performance and lower power consumption than current volatile memory, such as dynamic random access memory (DRAM) and static random access memory (SRAM). However, as the semiconductor integrated circuit (IC) industry has progressed into nanometer technology nodes, new challenges are arising in the fabrication of MRAM devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1G-1 is an enlarged view a portion of the IC device in FIG. 1F, in accordance with some embodiments.

FIG. 2-1 is an enlarged view a portion of the device shown in FIG. 2, in accordance with some embodiments.

DETAILED DESCRIPTION

Figure 1A:
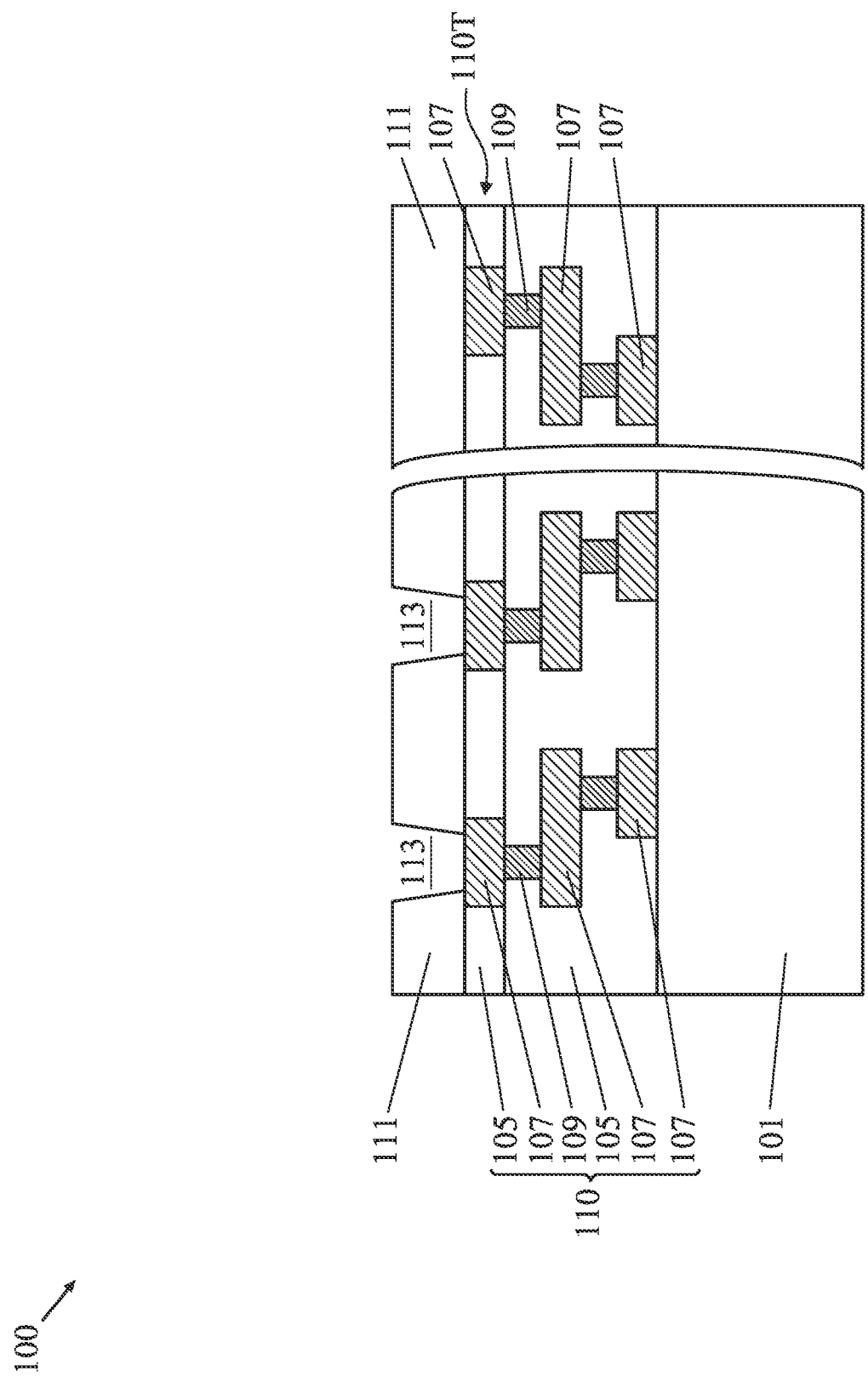
FIGS. 1A-1P illustrate cross-sectional views of respective structures at various stages of fabricating an integrated circuit (IC) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magnetic thin films magnetized perpendicular to the plane of the film have many applications for memory and data storage technologies, such as magneto-resistive random-access memory (MRAM) devices. MRAM devices typically include a magnetic-tunnel junction (MTJ) structure disposed between a bottom electrode and a top electrode and vertically arranged with a back-end-of-line (BEOL) metal stack. The MTJ structure includes a dielectric barrier layer sandwiched between a magnetic fixed layer ("reference layer") and a magnetic free layer ("free layer"). Due to the tunnel magnetoresistance effect, the resistance value between the reference layer and the free layer changes with the magnetization direction switch in the free layer. The magnetic orientation of the reference layer is static, while the magnetic orientation of the free layer is capable of switching between a parallel configuration with respect to that of the reference layer and an anti-parallel configuration. Parallel magnetizations ("P state") lead to a lower electric resistance, whereas anti-parallel magnetizations ("AP state") lead to a higher electric resistance. The two states of the resistance values are considered as two logic states "1" or "0" that are digitally stored in the MRAM device.

MRAM devices may utilize thin films with an "out-of-plane" (i.e., perpendicular to the film plane) magnetization direction, which is often referred to as perpendicular magnetic anisotropy (PMA). In a spin transfer torque ("STT") MRAM ("STT-MRAM") cell, the write current is applied passing through the entire MTJ, i.e., reference layer, the dielectric barrier layer, and the free layer, which sets the magnetization orientations of the free layer through the spin transfer torque effect. P-MTJs (perpendicular magnetic-tunnel junctions) spin valve structures are MTJ cells with PMA in the reference layer and the free layer, and are the building blocks that enable STT-MRAM and other spintronic devices. When the free layer has PMA, the current for switching the free layer from a P state to an AP state, or vice versa, may be proportional to the perpendicular anisotropy field. A strong PMA in a free layer allows data in STT-MRAM to be stored for extended period of time. One approach to enhance the PMA in a free layer is through the creation of interfacial PMA (iPMA) by forming dielectric-ferromagnetic interfaces in the p-MTJs. Other approaches, such as modification of interfacial oxygen concentration (e.g., tuning stoichiometry of the dielectrics), has also been used to control the degree of iPMA. However, the oxygen distribution profile of non-stoichiometric dielectrics (e.g., metal oxides) is difficult to manage and has limited tuning window. Embodiments of the present disclosure enhance iPMA and magnetization anisotropy by providing metal particles/dusts at ferromagnetic/dielectric interface of p-MJT spin valve structure. Various embodiments of such concept will be discussed in more detail below.

It should be understood that while some embodiments of the present disclosure are described in the context of MRAM devices, and more particularly, in the context of p-MJT spin valve structure, the concept and embodiments of the present disclosure are applicable to any applications involving magnetic thin films. A person having ordinary skill in the art will readily understand other modifications may be made that are contemplated within the scope of other embodiments. Although embodiments of the present disclosure may be described in a particular order, various other embodiments may be performed in any logical order and may include fewer or more steps than what is described herein. Additional steps can be provided before, during, and after the steps shown, and some of the steps described can be replaced, exchanged or eliminated for other embodiments of the present disclosure.

Figure 1B:
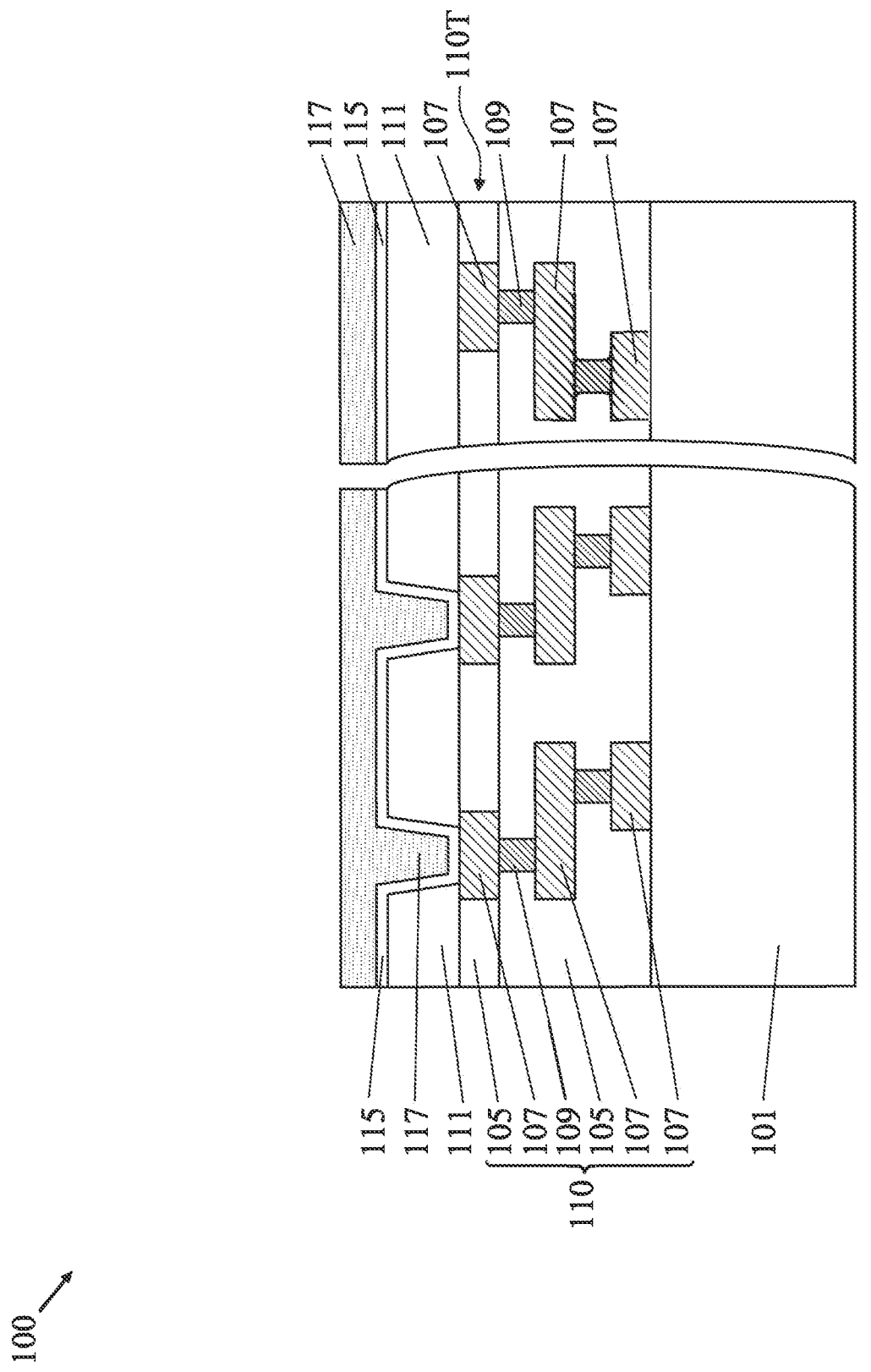
Figure 1C:
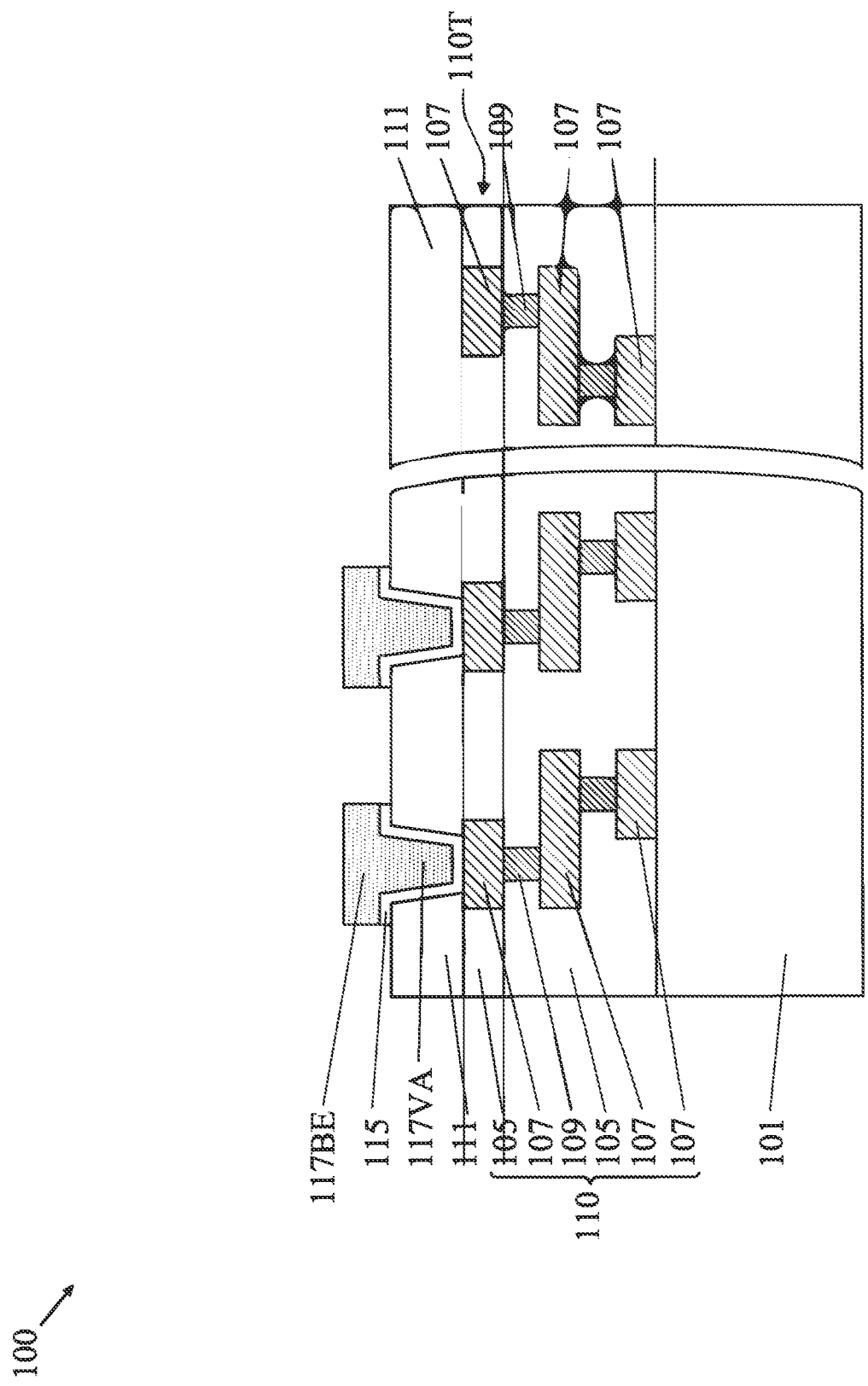
Figure 1D:
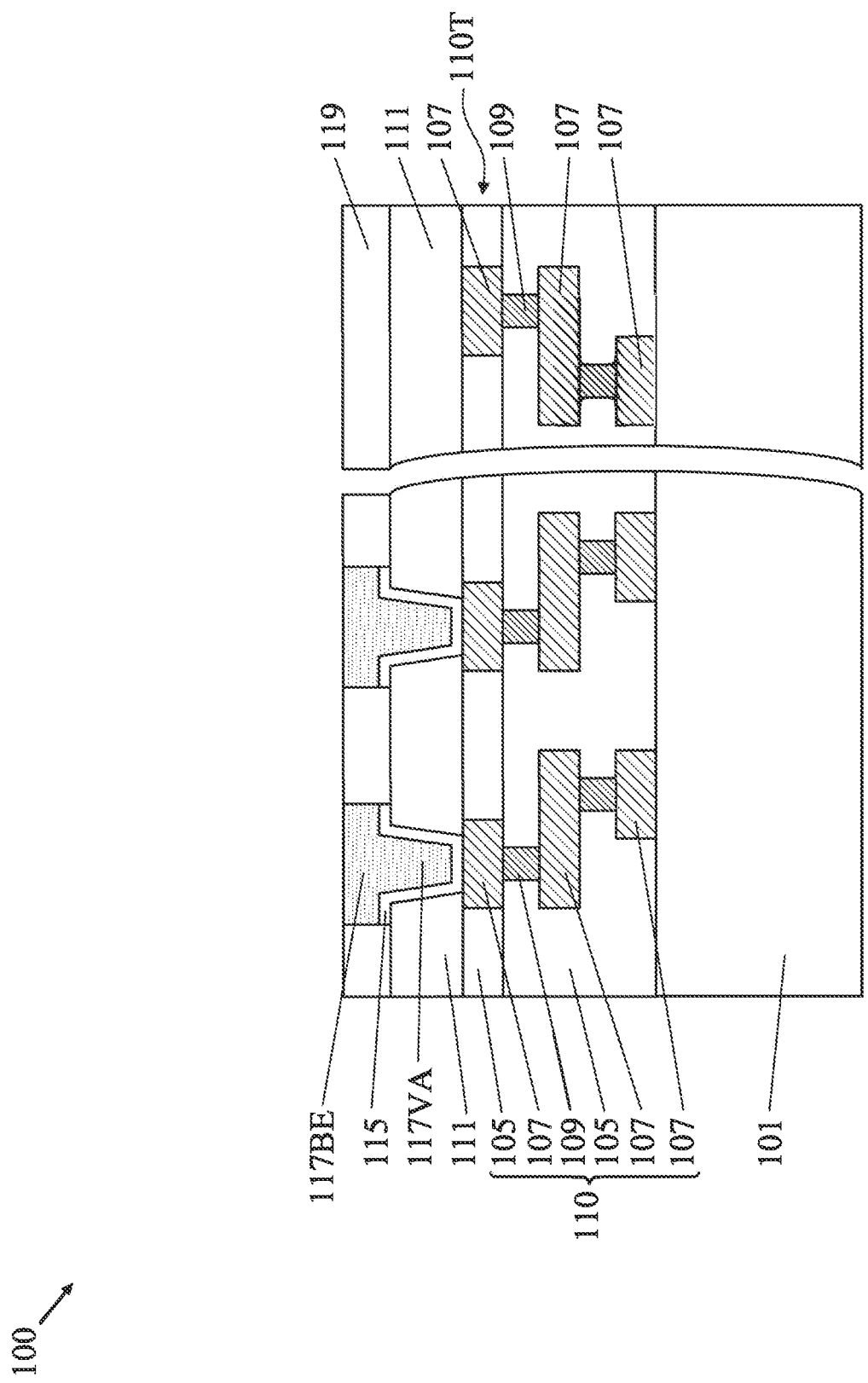
Figure 1E:
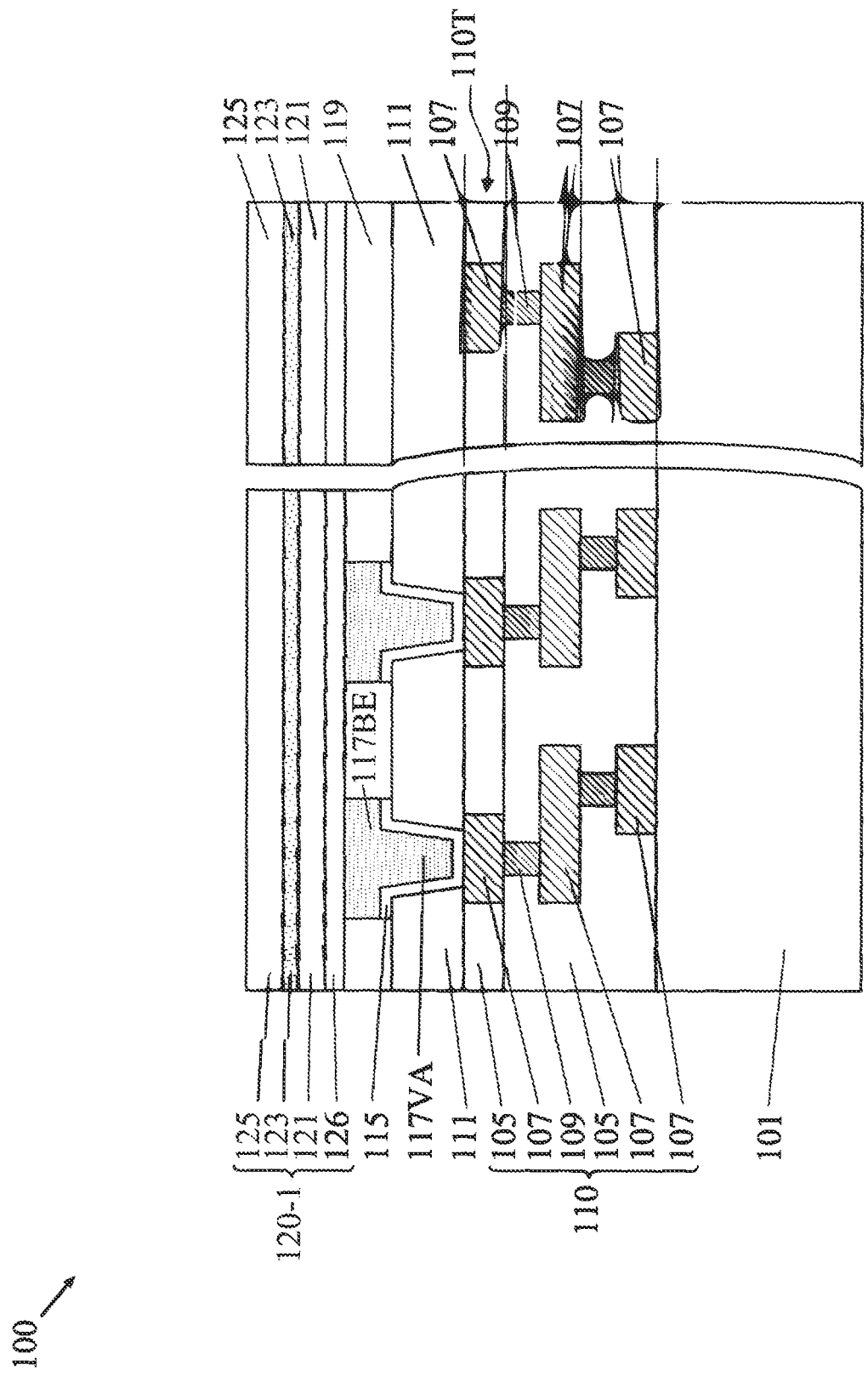
Figures 1, 1F:
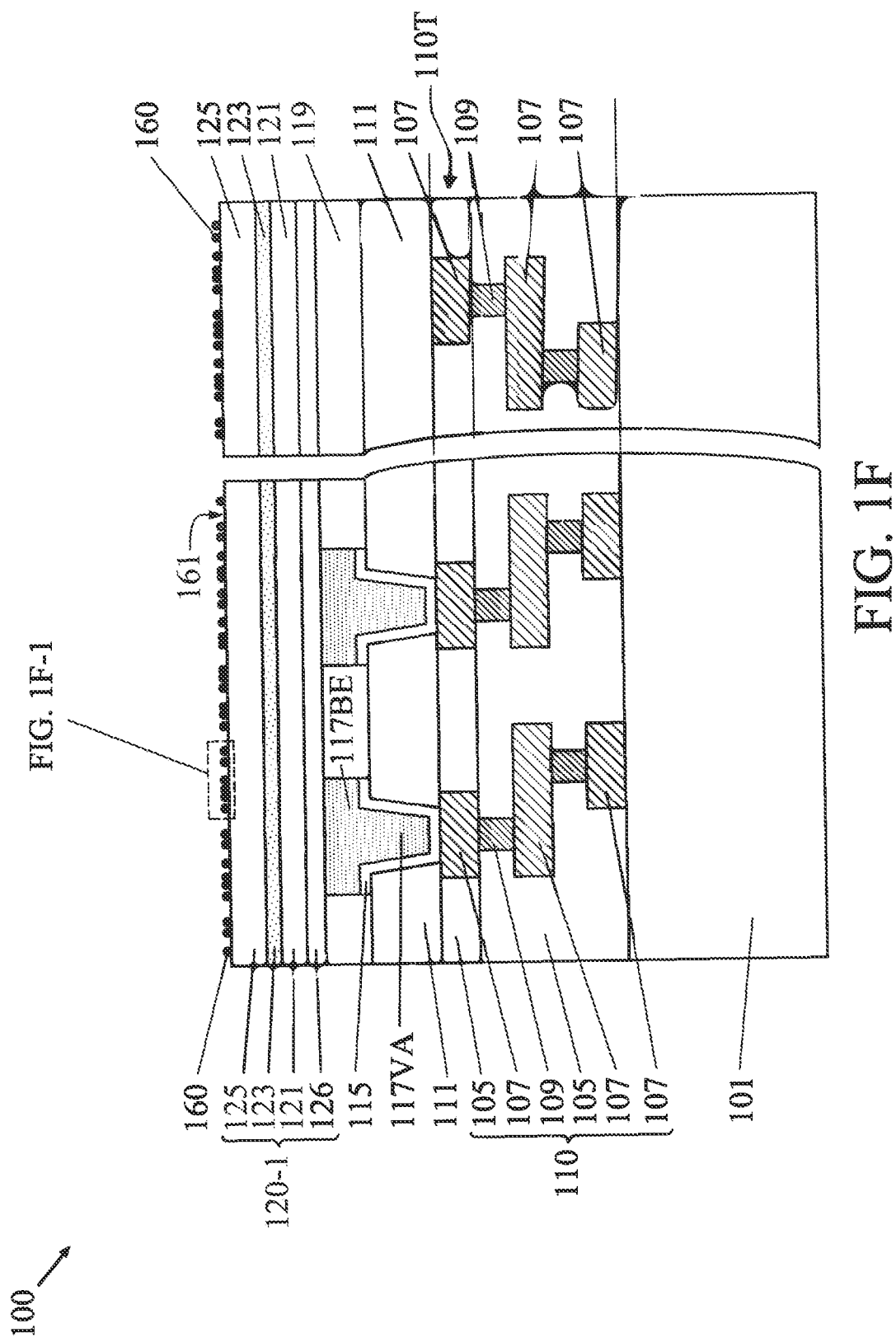
FIG. 1F-1 is an enlarged view a portion of the IC device in FIG. 1G, in accordance with some embodiments.
Figures 1, 1F:
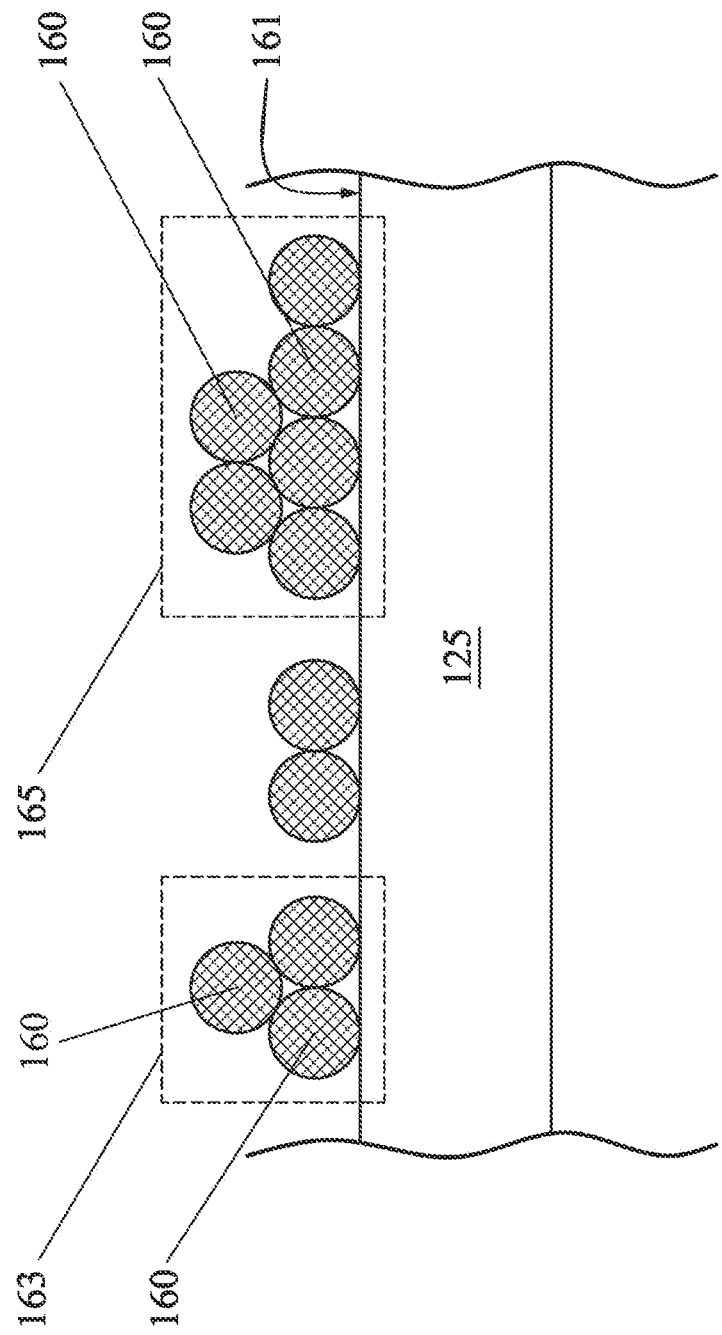
Figure 1G:
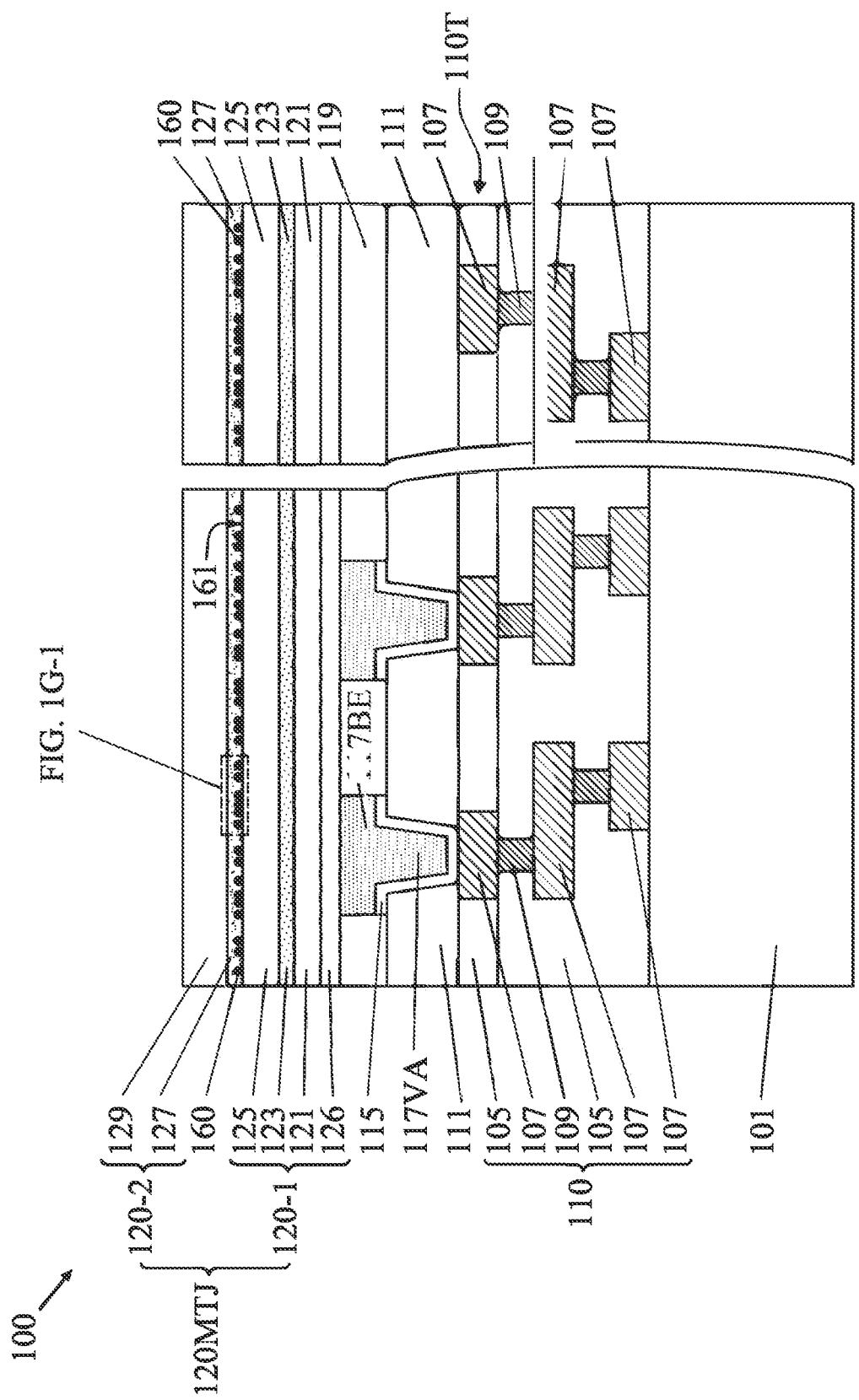
Figures 1, 1G:
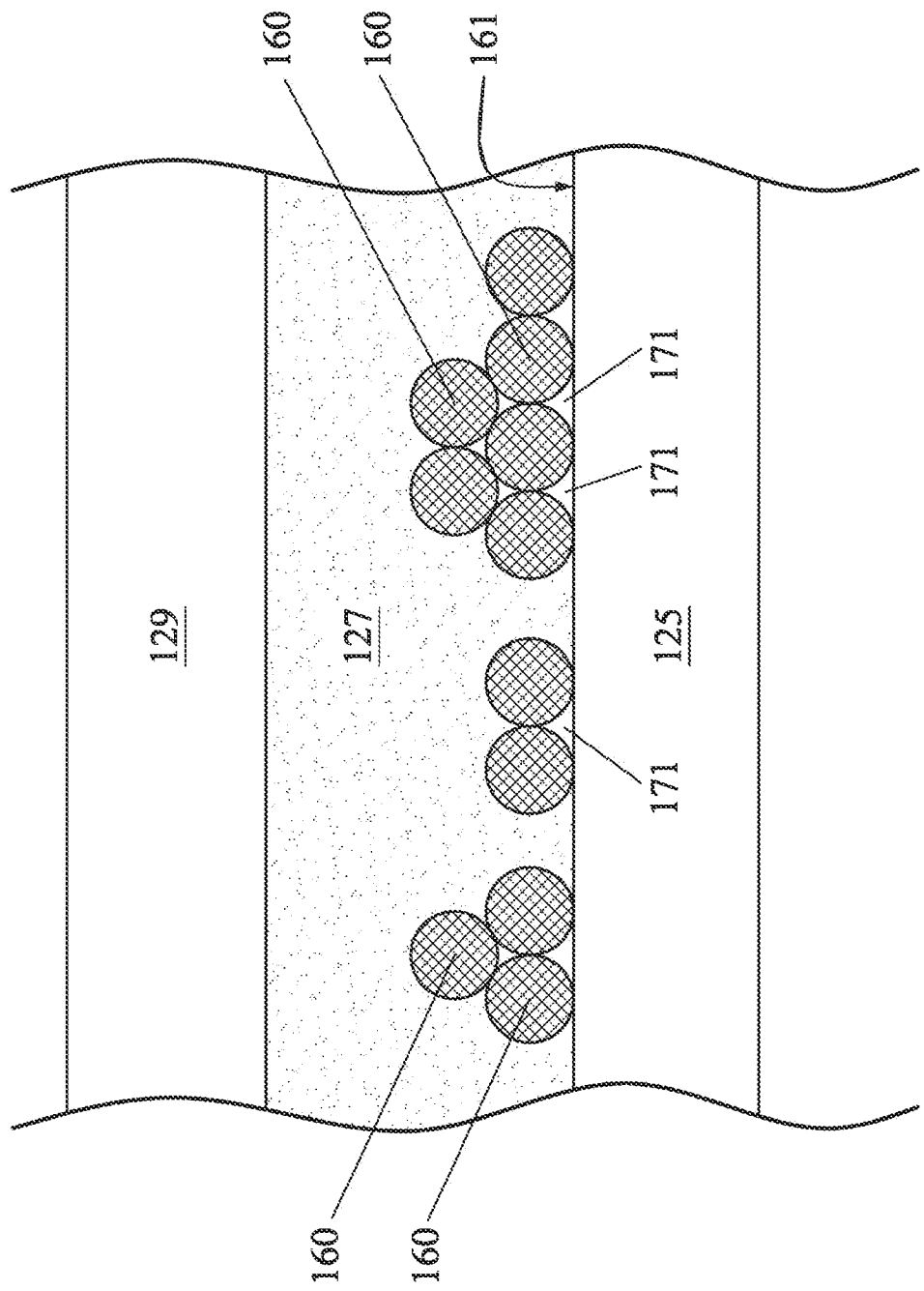
Figure 1H:
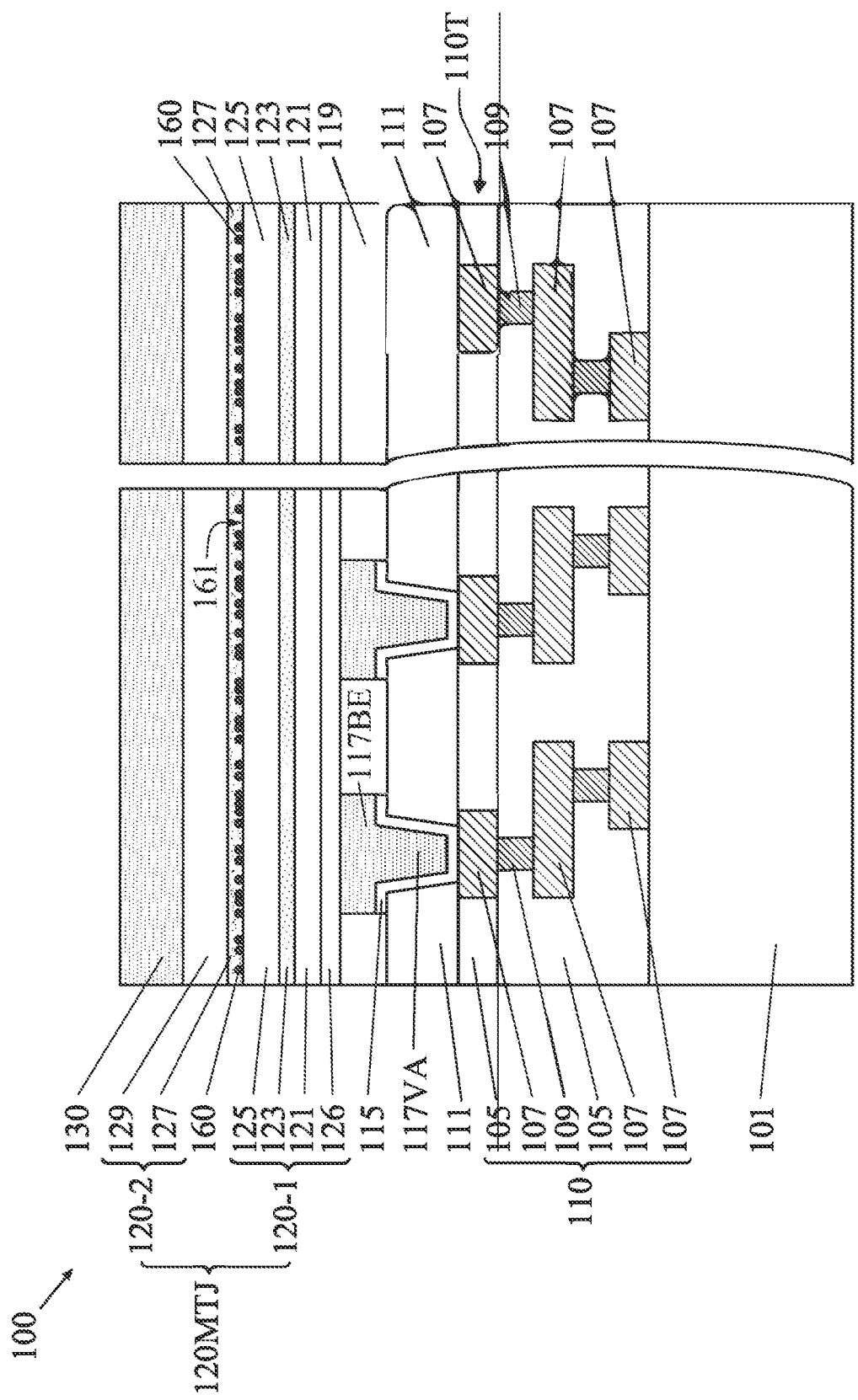
Figure 1I:
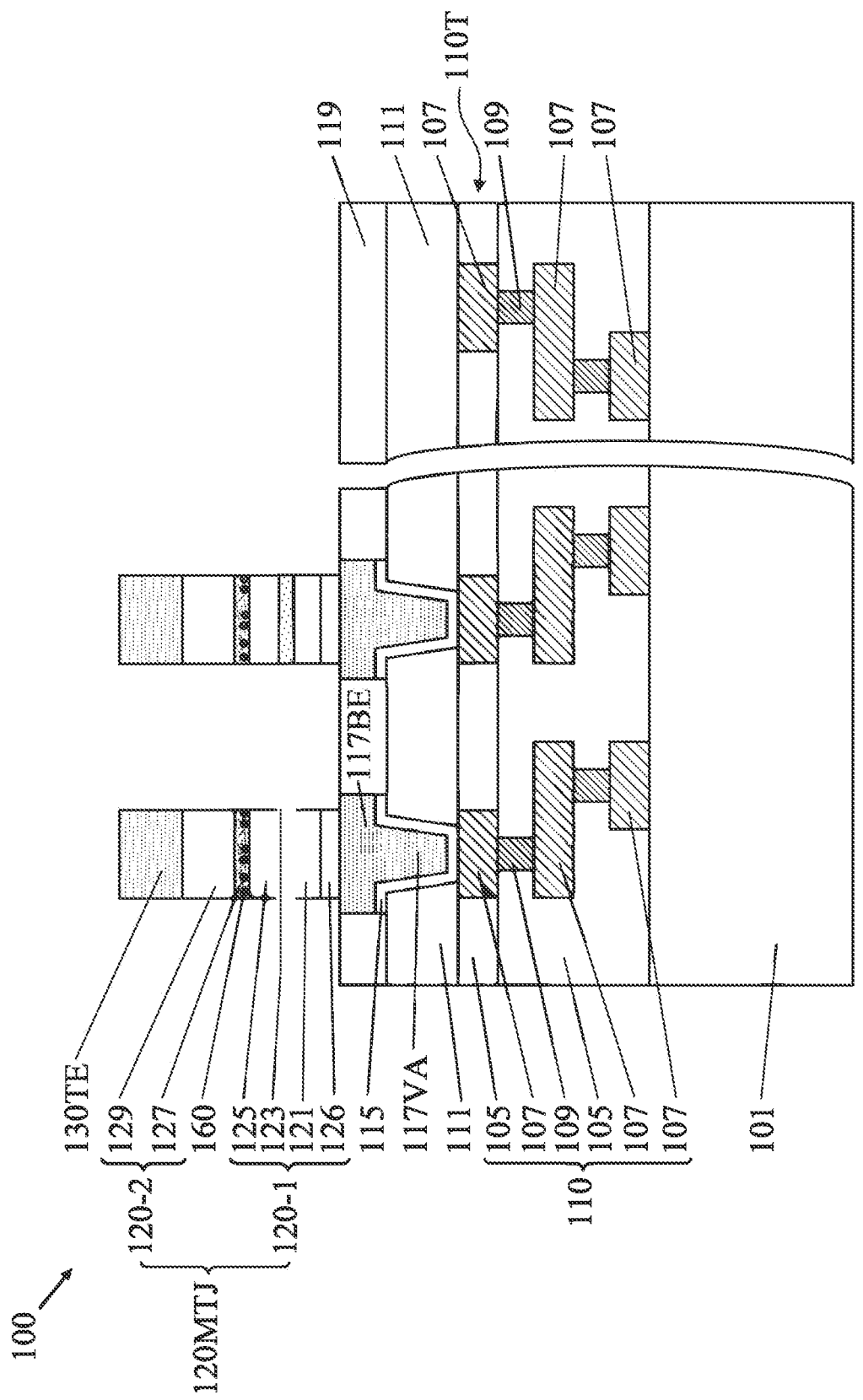
Figure 1J:
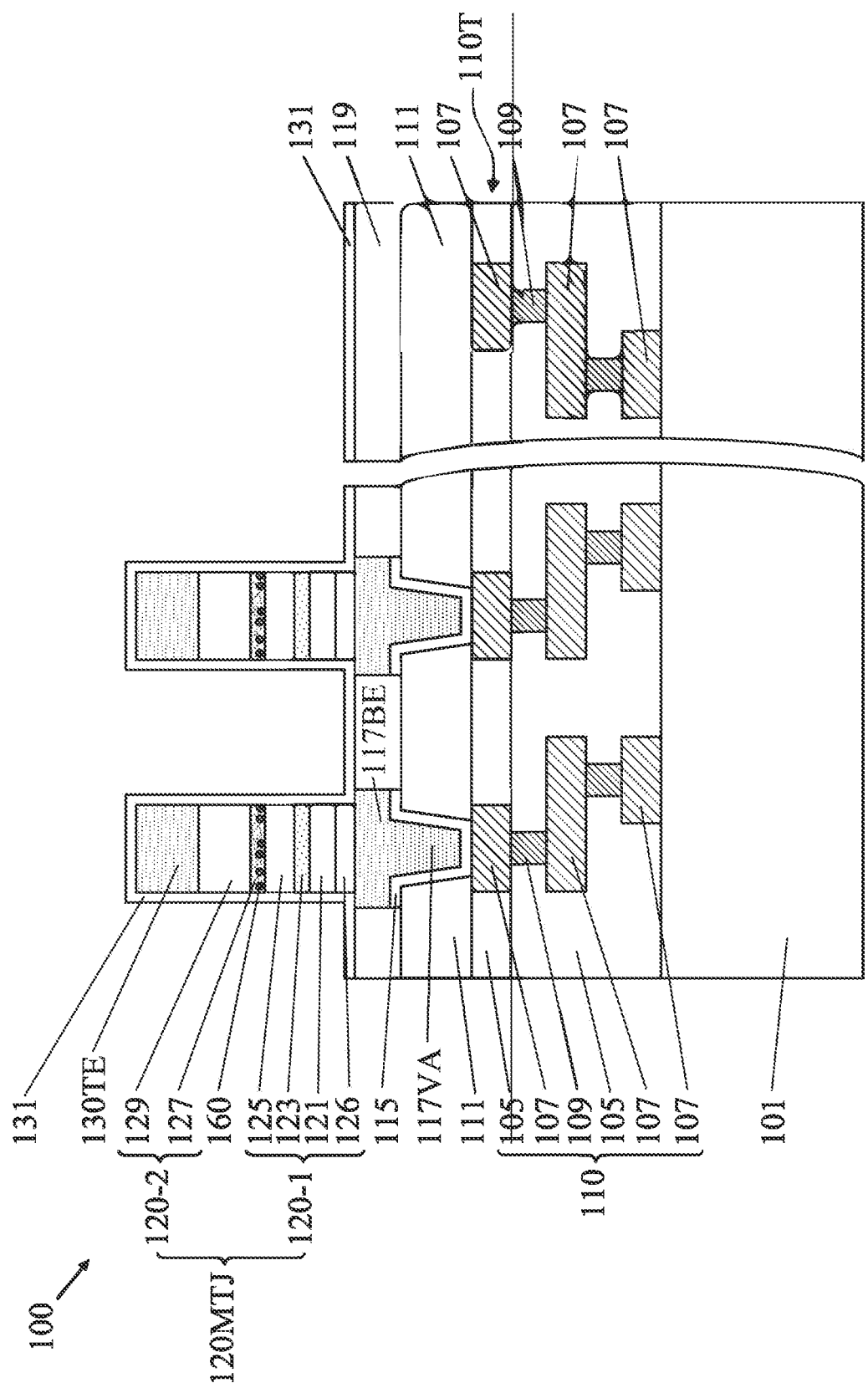
Figure 1K:
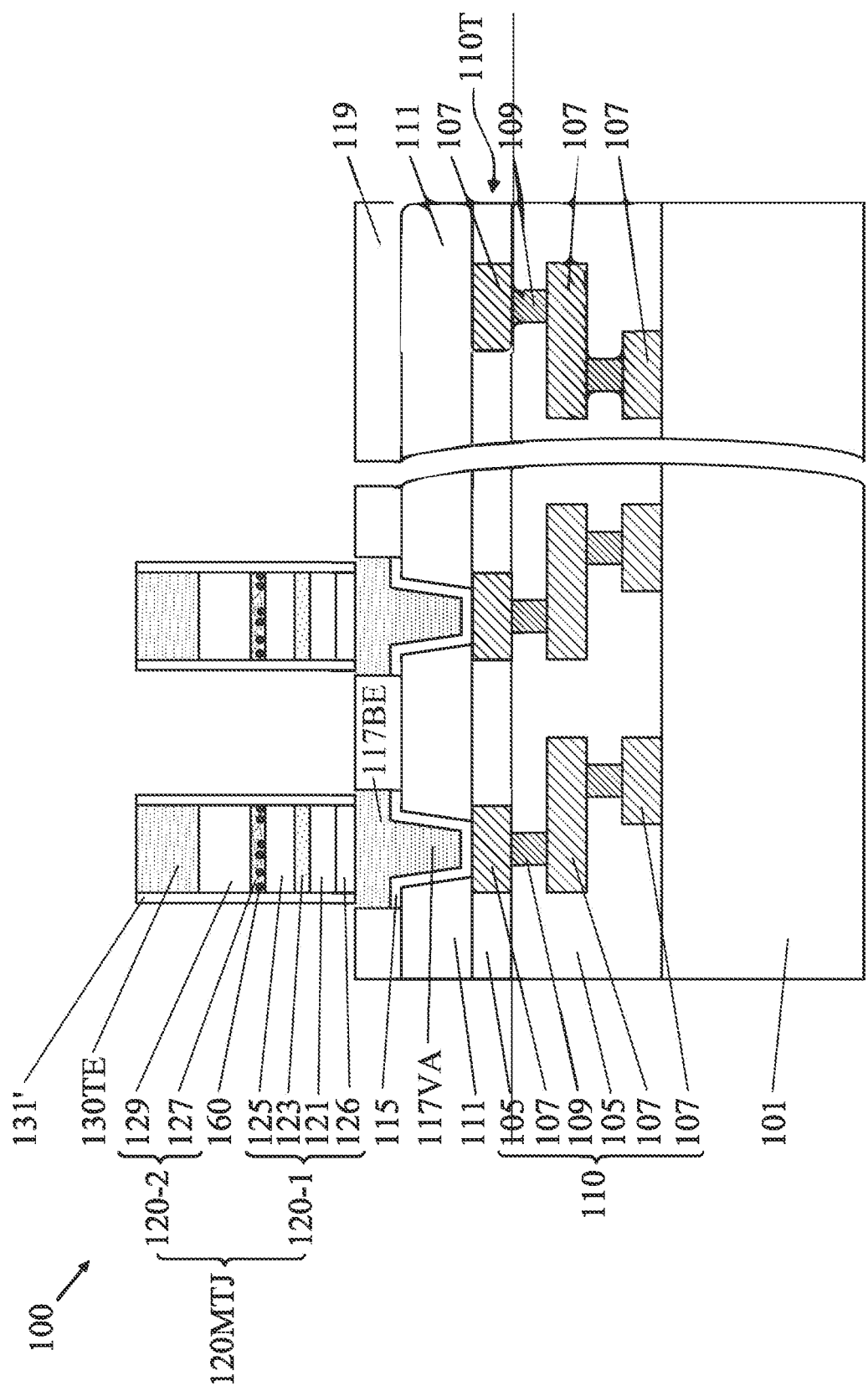
Figure 1L:
Figure 1M:
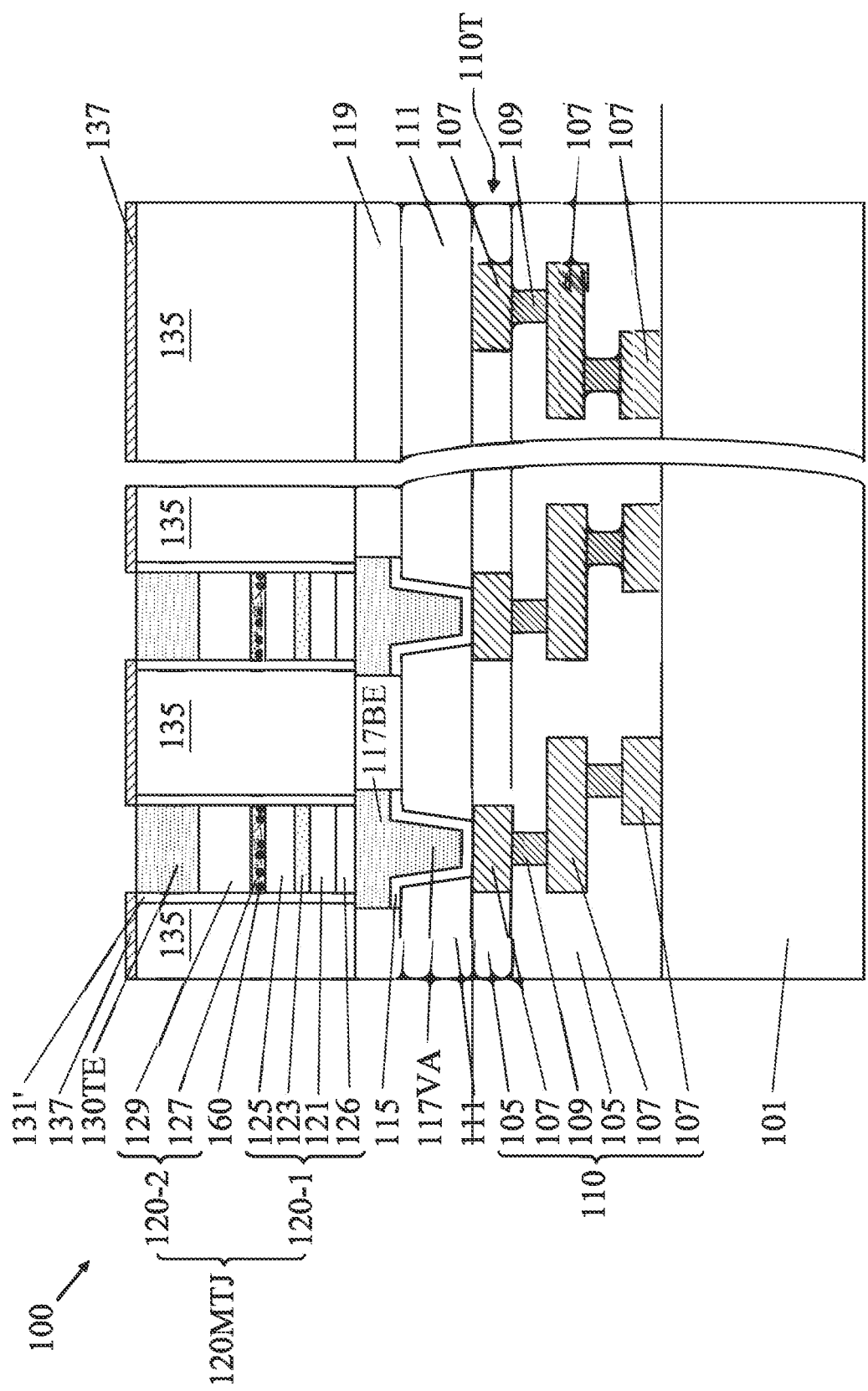
Figure 1N:
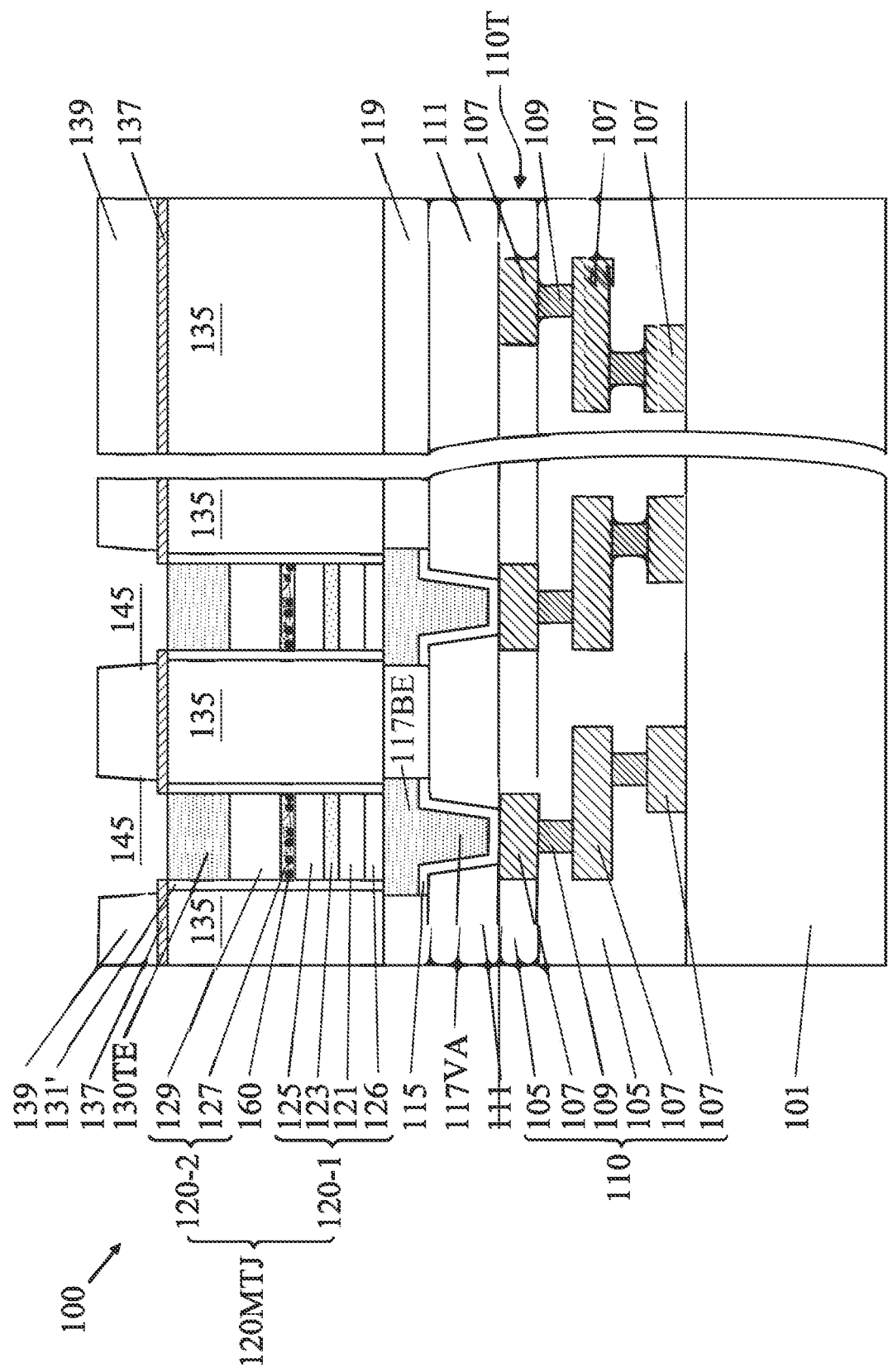
Figure 10:
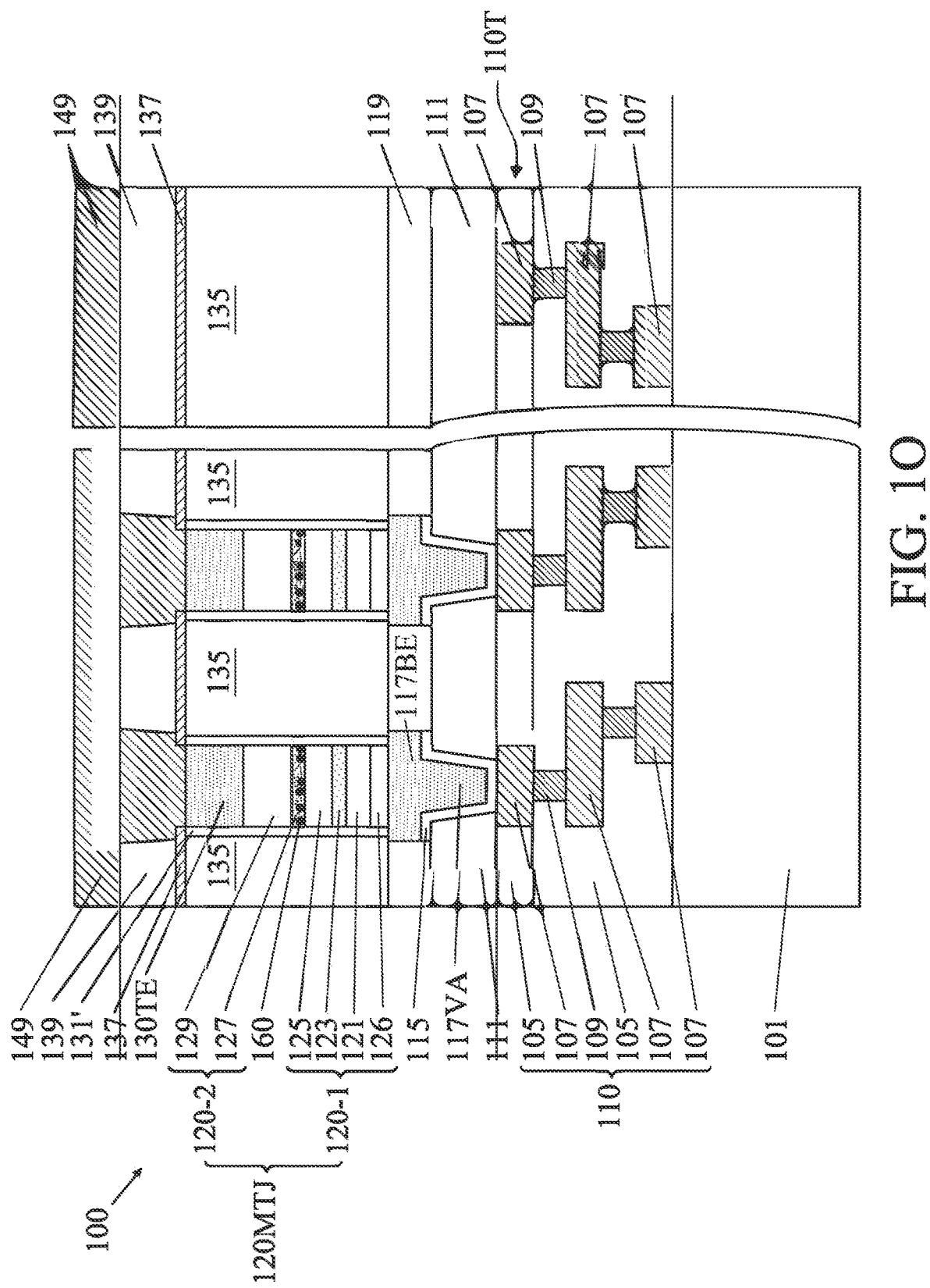
Figure 1P:
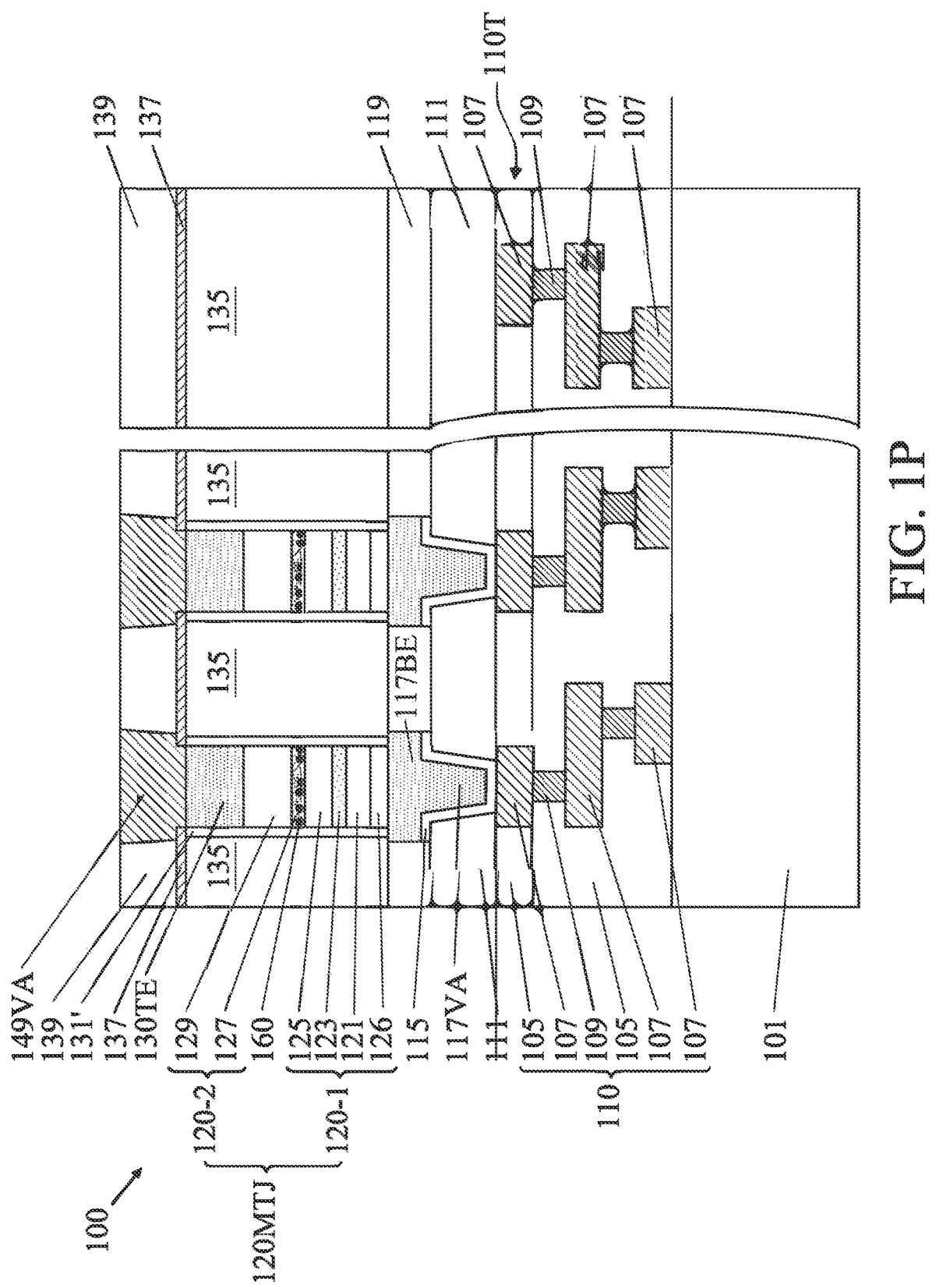

FIGS. 1A-1P illustrate cross-sectional views of respective structures at various stages of fabricating an integrated circuit (IC) device 100, in accordance with some embodiments. As shown in FIG. 1, the device 100 includes a substrate 101 and an interconnect structure 110 formed on the substrate 101. The substrate 101 may be a bulk semiconductor substrate or a silicon-on-insulator (SOI) substrate, which may be doped (e.g., with a p-type or an n-type dopant) or undoped. The SOI substrate may include an insulating layer (e.g., a silicon oxide or buried oxide (BOX)) disposed between two silicon layers. The substrate 101 may include a crystalline semiconductor material such as, but not limited to silicon (Si), germanium (Ge), a compound semiconductor such as, but not limited to silicon germanium (SiGe), silicon carbide (SiC), gallium arsenide (GaAs), indium antimonide (InSb), indium arsenide (InAs), indium phosphide (InP), gallium phosphide (GaP), gallium antimonide (GaSb), or an alloy semiconductor such as indium aluminum arsenide (InAlAs), indium gallium arsenide (InGaAs), gallium antimony phosphide (GaSbP), or gallium arsenic antimonide (GaAsSb). In one embodiment, the substrate 101 is made of silicon. In other alternatives, the substrate 101 may include a doped epi layer, a gradient semiconductor layer, and/or a semiconductor layer overlying another semiconductor layer of a different type, such as a silicon layer on a silicon germanium layer.

The substrate 101 includes various p-type doped regions and/or n-type doped regions, such as p-type wells and/or n-type wells, formed by a process such as ion implantation and/or diffusion. The substrate 101 may include functional elements such as transistors, diodes, imaging sensors, resistors, capacitors, inductors, memory cells, or a combination thereof. In some embodiments, the substrate 101 includes transistors, such as planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding the channels. The substrate 101 may also include lateral isolation features configured to separate various functional elements formed on and/or in the substrate 101.

The interconnect structure 110 includes multiple inter-metal dielectric (IMD) layers 105, multiple metal lines 107, and multiple conductive vias 109. The metal lines 107 and the conductive vias 109 are embedded in the IMD layers 105. There are multiple contacts (not shown) formed between the interconnect structure 110 and the substrate 101 to be electrically coupled to various functional elements formed on and/or in the substrate 101. The interconnect structure 110 includes an uppermost interconnect layer 110T that includes an uppermost IMD layer 105 and multiple uppermost metal lines 107 embedded in the uppermost IMD layer 105. The metal lines 107 of the same interconnect layer are disposed in the same IMD layer 105 to provide a horizontal electrical connection for various elements of the integrated circuits. The conductive vias 109 in the same IMD layer 105 are disposed between two metal lines 107 to provide a vertical electrical connection. It should be understood that the interconnect structure 110 is a part of a back-end-of-line (BEOL) structure and can be located at any position within the BEOL structure. For example, the interconnect structure 110 may be located between any adjacent pair of metal interconnect layers within the BEOL structure.

Suitable materials for the IMD layers 105 may include silicon dioxide ($SiO_2$), silicon oxynitride (SiON), silicon oxycarbide (SiOC), doped silicon oxide such as borophosphosilicate glass (BPSG), fused silica glass (FSG), phosphosilicate glass (PSG), boron doped silicon glass (BSG), organosilicate glass (OSG), spin-on-glass (SOG), and/or any suitable low-k dielectric materials (e.g., a material having a dielectric constant lower than that of silicon dioxide), and may be deposited by spin-on coating, chemical vapor deposition (CVD), flowable CVD (FCVD), plasma enhanced CVD (PECVD), physical vapor deposition (PVD), or any suitable deposition technique.

The metal lines 107 and conductive vias 109 may use any suitable electrical conductive materials such as aluminum (Al), copper (Cu), gold (Au), tungsten (W), platinum (Pt), silver (Ag), other suitable metal or metal alloy materials, or any combination thereof. The metal lines 107 and the conductive vias 109 may be formed by a dual damascene process, a single damascene process, or a combination thereof. A material for the metal lines 107 and the conductive vias 109 may be deposited on the IMD layer 105 and to fill the holes in the IMD layer 105 using PVD, atomic layer deposition (ALD), PECVD, electroplating, or other suitable deposition process. Any excess portions of the material over the IMD layer 105 are then removed by a planarization process, such as a chemical mechanical polishing (CMP) process to form the metal lines 107 and the conductive vias 109 in the IMD layer 105.

After the interconnect structure 110 is formed, an interlayer dielectric (ILD) layer 111 is deposited on the uppermost interconnect layer 110T in accordance with some embodiments. The ILD layer 111 is etched to form via holes 113 extending through the ILD layer 111 to expose the respective metal lines 107. A portion of the top surface of the metal lines 107 is exposed through the via holes 113. Suitable materials for the ILD layer 111 may include $SiO_2$, SiON, an oxide formed by tetraethylorthosilicate (TEOS), un-doped silicate glass, or other suitable dielectric material, and may be deposited by spin-on coating, CVD, FCVD, PECVD, PVD, or any suitable deposition technique. The via holes 113 may have slanted sidewalls. A patterned photoresist (not shown) may be formed on the ILD layer 111 using photolithography process. The patterned photoresist has openings corresponding to the locations of the metal lines 107. Then, the ILD layer 111 is etched using the patterned photoresist as an etch mask to form the via holes 113.

In FIG. 1B, a barrier layer 115 is formed on the ILD layer 111 and in the via holes 113. The barrier layer 115 is conformally deposited on the sidewalls and the bottom surface of the via holes 113. Suitable materials for the barrier layer 115 may include titanium (Ti), tantalum (Ta), tungsten (W), titanium nitride (TiN), tantalum nitride (TaN), tungsten nitride (WN), or a combination thereof. The barrier layer 115 may be deposited using PVD, CVD, ALD, PECVD, or other suitable deposition techniques. In some embodiments, the barrier layer 115 has a thickness in a range about 50 Å to about 200 Å.

A conductive material layer 117 is then deposited on the barrier layer 115. The conductive material layer 117 is deposited over the ILD layer 111 and to fill the via holes 113. The conductive material layer 117 may be formed of metal, metal alloy, metal nitride, or a combination thereof. Suitable materials for the conductive material layer 117 may include TiN, Ta, Cu, TaN, Ti, W, Al, Au, cobalt (Co), aluminum-copper alloy (AlCu), or other suitable conductive material(s) or layered combination thereof. The conductive material layer 117 may be deposited using PVD, CVD, ALD, or other suitable deposition techniques. In some embodiments, the conductive material layer 117 has a thickness in a range from about 500 Å to about 1000 Å.

In FIG. 1C, the conductive material layer 117 and the barrier layer 115 are patterned together to form multiple bottom electrodes 117BE and multiple bottom electrode vias 117VA in accordance with some embodiments. The portion of the conductive material layer 117 above the ILD layer 111 is patterned to form the bottom electrodes 117BE. Another portion of the conductive material layer 117 in the via holes 113 forms the bottom electrode vias 117VA. Each of the bottom electrode vias 117VA is disposed under and is connected with the respective bottom electrode 117BE. The bottom electrode via 117VA and the bottom electrode 117BE are combined to be an integrated structure made of the same material. The barrier layer 115 is disposed between the bottom electrode vias 117VA and the ILD layer 111 and can be used as a diffusion barrier layer, an adhesion layer, or a combination thereof. The conductive material layer 117 and the barrier layer 115 are patterned together using photolithography and etching processes.

In FIG. 1D, an etch stop layer 119 is deposited on the ILD layer 111 to surround the bottom electrodes 117BE in accordance with some embodiments. Suitable materials for etch stop layer 119 may include SiCN, SiN, $SiO_2$, SiC, SiOC, a low dielectric constant (k) dielectric material, other suitable dielectric material, or any combination thereof. The etch stop layer 119 may be deposited by CVD, ALD, spin-on coating or other suitable deposition techniques. The etch stop layer 119 may be deposited over the bottom electrodes 117BE and the ILD layer 111, followed by a planarization process such a CMP process to remove excess portions of the deposited etch stop layer 119 on the bottom electrodes 117BE. After the CMP process, the bottom electrodes 117BE are exposed through the etch stop layer 119. The bottom electrodes 117BE and the etch stop layer 119 may have a coplanar top surface. In some embodiments, the top surface of the etch stop layer 119 is slightly lower than that of the bottom electrodes 117BE. In some embodiments, the etch stop layer 119 has a thickness in a range from about 200 Å to about 500 Å.

In FIG. 1E, a first material layer stack 120-1 of an MTJ structure 120 (FIG. 1G) is deposited on the bottom electrodes 117BE and the etch stop layer 119, in accordance with some embodiments. The first material layer stack 120-1 includes an anti-ferromagnetic (AFM) layer 126 arranged over the bottom electrodes 117BE and the etch stop layer 119, a first ferromagnetic layer 121 arranged over the AFM layer 126, an insulating barrier layer 123 arranged over the first ferromagnetic layer 121, and a second ferromagnetic layer 125 arranged over the insulating barrier layer 123. The AFM layer 126 may be made of platinum manganese (PtMn), iridium manganese (IrMn), rhodium manganese (RhMn), or iron manganese (FeMn). The AFM layer 126 may be deposited using various deposition processes such as CVD, PVD, or ALD process. The AFM layer 126 may have a thickness in a range from about 60 Å to about 120 Å.

The first ferromagnetic layer 121 arranged on the AFM layer 126 can be used as a pinned layer (or reference layer) due to the magnetic moment of the pinned layer is pinned in a particular direction by the AFM layer 126. Therefore, the first ferromagnetic layer 121 has a fixed magnetization oriented in a direction perpendicular to a surface thereof. The first ferromagnetic layer 121 does not change its magnetic moment during operation of the MRAM cells. Suitable materials for the first ferromagnetic layer 121 may include, but are not limited to, CoFeB, CoFeTa, NiFe, Co, CoFe, CoPt, CoPd, FePt, Ru, or other alloys of Ni, Co, and Fe. The first ferromagnetic layer 121 may be deposited using various deposition processes such as CVD, PVD, or ALD process. In some embodiments, the first ferromagnetic layer 121 may have a thickness in a range from about 15 Å to about 30 Å.

Unlike the first ferromagnetic layer 121, the magnetic moment direction of the second ferromagnetic layer 125 can change under various conditions during operation of the MRAM cells because there is no AFM layer adjacent to the second ferromagnetic layer 125. Therefore, the second ferromagnetic layer 125 has a magnetization that may be switched from a parallel direction to an anti-parallel direction with respect to the fixed magnetization of the first ferromagnetic layer 121. Suitable materials for the second ferromagnetic layer 125 may include, but are not limited to, CoFeB, CoFeTa, NiFe, Co, CoFe, CoPt, CoPd, FePt, Ru, or other alloys of Ni, Co and Fe. The second ferromagnetic layer 125 may be deposited using various deposition processes such as CVD, PVD, or ALD process. In some embodiments, the second ferromagnetic layer 125 may have a thickness in a range from about 5 Å to about 20 Å.

The insulating barrier layer 123 may enhance the tunnel magnetoresistance phenomena (TMR) and spin transfer efficiency for the MTJ structure 120. The insulating barrier layer 123 may be formed of dielectric material, such as magnesium oxide (MgO), aluminum oxide (AlOx or $Al_2O_3$), aluminum nitride (AlN), aluminum oxynitride (AlON), other suitable materials, or a combination thereof. The insulating barrier layer 123 may be deposited using various deposition processes such as CVD, PVD, or ALD process. In some embodiments, the insulating barrier layer 123 may have a thickness in a range from about 5 Å to about 15 Å.

In some embodiments, the first ferromagnetic layer 121 can be used as a free layer and the second ferromagnetic layer 125 can be used as a reference layer. In such a case, the AFM layer 126 is arranged under the second ferromagnetic layer 125 and above the insulating barrier layer 123.

In FIG. 1F, a plurality of metal particles (or metal dusts) 160 are formed on the second ferromagnetic layer 125 of the first material layer stack 120-1, in accordance with some embodiments. The formation of the plurality of metal particles 160 at an interface between the second ferromagnetic layer 125 and a subsequent capping layer 129 (to be discussed in FIG. 1G) generates interfacial PMA (iPMA) that induces or enhances magnetization in the free layer (e.g., second ferromagnetic layer 125). The insertion of the metal particles 160 also leads to increased TMR ratio and reduced resistance-area (RA) product of the MTJ structure 120. The provision of metal particles 160 can modulate iPMA in the free layer by tuning just process parameters during formation of the metal particles 160, without having to deal with issues of tuning non-stoichiometric oxygen content in a subsequent metal oxide layer (e.g., Hk enhancing layer 127).

In some embodiments, the plurality of metal particles 160 are provided on the second ferromagnetic layer 125 in the form of a monolayer layer, which may include a single, closely packed layer of atoms or molecules. Particularly, the plurality of metal particles 160 are spontaneously dispersed or arranged on the second ferromagnetic layer 125 in a discrete and non-continuous fashion. In other words, portions of a top surface 161 of the second ferromagnetic layer 125 are exposed to air upon completion of the deposition of the metal particles 160. FIG. 1F-1 is an enlarged view of a portion of the metal particles 160 showing a monolayer of a plurality of metal particles 160 is formed in a discrete and non-continuous manner on the second ferromagnetic layer 125. In some embodiments, one or more metal particles 160 may be stacked on a monolayer of a plurality of metal particles 160 that is formed in a discrete and non-continuous manner, such as regions 163, 165 shown in FIG. 1F-1. It should be noted that metal particles 160 are not drawn to scale and are depicted schematically for illustration purposes.

In various embodiments, the metal particles 160 may include or be formed of a non-magnetic metal material. In some embodiments, the metal particles 160 includes a non-magnetic transition metal. Suitable materials for the metal particles 160 may include, but are not limited to, molybdenum (Mo), magnesium (Mg), chromium (Cr), ruthenium (Ru), palladium (Pd), tantalum (Ta), titanium (Ti), platinum (Pt), tungsten (W), zirconium (Zr), hafnium (Hf), yttrium (Y), rhodium (Rh), or the like, or any combination thereof. In some embodiments, the metal particles 160 excludes elements utilizing in the free layer (e.g., second ferromagnetic layer). The metal particles 160 may be formed by PVD (sputtering), ALD, PEALD, or other suitable deposition techniques. In some embodiments, the metal particles 160 are formed on the second ferromagnetic layer 125 by PVD (sputtering) process. The PVD process may be performed under time-controlled conditions to suppress the amount of the metal particles 160 sputtered from the target. In any case, the PVD process is performed such that the metal particles 160 do not cover entire top surface 161 of the second ferromagnetic layer 125. As a result, the metal particles 160 are scattered over a top surface of the topmost layer (e.g., second ferromagnetic layer 125) of the first material layer stack 120-1 in the form of discrete and non-continuous portions. In some embodiments, the plurality of metal particles 160 as deposited may have a size ranging from 2 atoms to 100 (e.g., 4-50 atoms) atoms extending in any direction on the top surface 161 of the second ferromagnetic layer 125, and the size of the metal particles 160 may vary depending on the material used and processing time of the deposition technique used for forming the metal particles 160.

In FIG. 1G, after the formation of the metal particles 160, a second material layer stack 120-2 of the MTJ structure 120 is formed over the second ferromagnetic layer 125, in accordance with some embodiments. In one exemplary embodiment, the second material layer stack 120-2 includes a perpendicular anisotropy field (Hk) enhancing layer 127 and a capping layer 129 formed on the Hk enhancing layer 127. The Hk enhancing layer 127 may be also referred to as a cap layer in a bottom spin valve configuration. The Hk enhancing layer 127 and the second ferromagnetic layer 125 create a ferromagnetic-dielectric interface (in addition to the ferromagnetic-dielectric interface created between the insulating barrier layer 123 and the second ferromagnetic layer 125) to help increase the perpendicular anisotropy field of the second ferromagnetic layer 125. In various embodiments, the Hk enhancing layer 127 is formed on the plurality of metal particles 160 and over the second ferromagnetic layer 125. Once the Hk enhancing layer 127 is formed, the plurality of metal particles 160 are encapsulated or embedded within the Hk enhancing layer 127 between the second ferromagnetic layer 125 and the capping layer 129. Particularly, since the metal particles 160 are disposed in a discrete and non-continuous manner, some portions of the Hk enhancing layer 127 are in contact with the exterior surfaces of the metal particles 160 and some portions of the Hk enhancing layer 127 are in direct contact with the top surface 161 of the second ferromagnetic layer 125 at regions where the metal particles 160 are not present. In some cases, the metal particles 160 are dispersed on the second ferromagnetic layer 125 such that at least two adjacent metal particles 160 are separated from each other by the Hk enhancing layer 127. FIG. 1G-1 illustrates an enlarged view of a portion of the MTJ structure 120 showing the metal particles 160 discretely disposed on the second ferromagnetic layer 125 and are encapsulated by the Hk enhancing layer 127. As can be seen, a portion of the Hk enhancing layer 127 is in direct contact with the top surface 161 of the second ferromagnetic layer 125 at regions where no metal particles 160 are present, while a portion of the Hk enhancing layer 127 is in contact with the exposed surfaces of the metal particles 160. In some embodiments, two or more immediately adjoining metal particles 160 may block the Hk enhancing layer 127 from contacting the second ferromagnetic layer 125, resulting in air gaps 171 formed between the immediately adjoining metal particles 160 and the top surface 161 of the second ferromagnetic layer 125. In some embodiments, the Hk enhancing layer 127 is deposited such that one or more air gaps 171 are filled with the Hk enhancing layer 127. In some embodiments, the Hk enhancing layer 127 is deposited such that the metal particles 160 are substantially embedded in the Hk enhancing layer 127, meaning all the air gaps 171 are filled with the Hk enhancing layer 127.

The Hk enhancing layer 127 may be a metal oxide or metal oxynitride layer having a thickness and oxidation state that are controlled to provide a resistance area (RA) product smaller than that in the insulating barrier layer 123 in order to minimize a decrease in magnetoresistive ratio (DRR). DRR is expressed as dR/R where dR is the difference in resistance between the P and AP states, and R is the resistance of the P state. Larger DRR means a higher read margin. The Hk enhancing layer 127 may be a single layer that is an oxide or oxynitride of one or more of Mg, Si, Ti, barium (Ba), calcium (Ca), lanthanum (La), Al, manganese (Mn), vanadium (V), and Hf. In one embodiment, the Hk enhancing layer 127 is MgO. Alternatively, the Hk enhancing layer 127 may be a laminated layer formed of one or more of the metal oxides or oxynitrides described herein. The Hk enhancing layer 127 may have stoichiometric or non-stoichiometric oxygen content. The Hk enhancing layer 127 may have a thickness in a range from about 5 Å to about 15 Å, and may be deposited using various deposition processes such as PVD, ALD, or other suitable deposition technique.

After the Hk enhancing layer 127 is formed, the capping layer 129 is formed on the Hk enhancing layer 127. Since the Hk enhancing layer 127 may be under-oxidized to minimize RA product in the MTJ structure 120, there is a tendency for metals or other species from a subsequent hard mask or top electrode layer 130 (FIG. 1H) to migrate through vacant lattice sites in the Hk enhancing layer to the free layer (e.g., second ferromagnetic layer 125) and thus degrade DRR. The use of the capping layer 129 and its thickness is controlled to prevent or minimize unwanted metals or other species from diffusing through the Hk enhancing layer 127 and into the free layer. In some embodiments, the capping layer 129 has a metal nitride or metal oxynitride composition. The capping layer 129 may include a material chemically different from the Hk enhancing layer 127. In some embodiments, the capping layer 129 comprises a metal or alloy (M1) where the metal or alloy is one or more of Ti, Zr, Hf, V, Nb, Ta, Cr, Mo, W, or the like, to form a conductive nitride (M1N) or oxynitride (M1ON). The capping layer 129 may have a thickness in a range from about 50 Å to about 150 Å, and may be deposited using various deposition processes such as PVD, ALD, or other suitable deposition technique. Alternatively, a metal film may be formed first by sputtering and then converting it into a metal nitride or metal oxynitride by a nitridation process and/or an oxygen plasma treatment.

It some embodiments, the Hk enhancing layer 127 may be omitted. In such cases, the capping layer 129 is formed on the metal particles 160. Therefore, the capping layer 129 may have a portion in contact with exposed surfaces of the metal particles 160 and a portion in direct contact with the top surface 161 of the second ferromagnetic layer 125 at regions where the metal particles 160 are not present.

In FIG. 1H, after the capping layer 129 is formed on the Hk enhancing layer 127 (or after the MTJ structure 120 is formed), a hard mask or top electrode layer 130 is formed on the capping layer 129, in accordance with some embodiments. The top electrode layer 130 may include or be formed of a conductive material, such as Ta, TaN, Ti, TiN, Cu, Co, W, Al, Au, aluminum-copper (AlCu), or other suitable conductive material(s) or layered combination thereof. In some embodiment, the top electrode layer 130 has a thickness in a range from about 100 Å to about 600 Å, and may be deposited by PVD, CVD, ALD, or other suitable deposition technique.

In FIG. 1I, the top electrode layer 130 and the MTJ structure 120 are patterned together to form multiple top electrodes 130TE and multiple MTJ structures 120MTJ, in accordance with some embodiments. The patterned MTJ structures 120MTJ are disposed between the respective top electrode 130TE and bottom electrodes 117BE. Each of the patterned MTJ structure 120MTJ includes the patterned first material layer stack 120-1, the patterned second material layer stack 120-2, and the plurality of metal particles 160 disposed on an interface between the first material layer stack 120-1 and the second material layer stack 120-2. The metal particles 160 are disposed discretely within the Hk enhancing layer 127 between the second ferromagnetic layer 125 and the capping layer 129. The sidewalls of the top electrodes 130TE may be vertically aligned with the sidewalls of the patterned MTJ structure 120MTJ.

The top electrode layer 130 and the MTJ structure 120 are patterned using photolithography and etching processes. An etch mask (not shown) may be formed on the top electrode layer 130 and be used during the etching process. In some embodiments, the etch mask is a patterned photoresist formed by the photolithography process. In such a case, the photoresist layer is coated on the top electrode layer 130 by a suitable process, such as spin-on coating. The photoresist layer is then exposed to a light energy through a photomask. The exposed photoresist layer is then developed to form the patterned photoresist. In some embodiments, the etch mask is a hard mask. In this case, a hard mask layer is deposited on the top electrode layer 130 and then a patterned photoresist is formed on the hard mask layer using the photolithography process discussed above. Next, an etching process is performed on the hard mask layer to transfer the pattern from the patterned photoresist to the hard mask layer to form the hard mask.

In some embodiments, the top electrode layer 130 and the MTJ structure 120 are etched together by an ion beam etch (IBE) process. The IBE process may use an etching gas such as He, Ne, Ar, Kr, Xe, or a combination thereof, and a power in a range from about 50 W to about 3000 W. Alternatively, the top electrode layer 130 and the MTJ structure 120 may be etched separately using different process conditions of the IBE process. In some embodiments, the top electrode layer 130 and the MTJ structure 120 are etched by a reactive-ion-etch (RIE) process. The RIE process may use an etching gas such as CH4, a CHF species (including $CH_3F$, $CH_2F_2$, or $CHF_3$), a CF species (including $C_4F_8$, $C_4F_6$, or $CF_4$), $H_2$, HBr, CO, $CO_2$, $O_2$, $BCl_3$, $Cl_2$, $N_2$, He, Ne, Ar or a combination thereof. The RIE process may be performed with a power of about 150 W to about 3000 W, and a bias power of about 0 V to about 2000 V. Likewise, the top electrode layer 130 and the MTJ structure 120 may be etched together in one step of the same process condition, or etched separately using different process conditions of the RIE process.

In FIG. 1J, a spacer layer 131 is conformally deposited on the top surfaces of the top electrodes 130TE, the sidewalls of the top electrodes 130TE, the sidewalls of the patterned MTJ structures 120MTJ, and the exposed top surfaces of the etch stop layer 119 and the bottom electrodes 117BE, in accordance with some embodiments. The spacer layer 131 may include or be formed of $SiO_2$, SiN, SiC, SiCN, SiON, SiOC, or other suitable dielectric material, and may be deposited by CVD, PECVD, ALD, PVD, sputtering, or other suitable deposition techniques. In some embodiments, the spacer layer 131 has a thickness in a range of about 50 Å to about 250 Å.

In FIG. 1K, the spacer layer 131 is etched to form a spacer 131' on the sidewalls of the top electrodes 130TE and the patterned MTJ structures 120MTJ, in accordance with some embodiments. The spacer 131' may cover all or a portion of the exposed top surfaces of the bottom electrodes 117BE. The spacer 131' may be etched by an anisotropic etching process such as an inductively coupled plasma (ICP) type reactive-ion-etch (RIE) process. While one spacer 131' is shown in FIG. 1K, in some embodiments a second spacer (not shown), such as the spacer 131', may be formed on the spacer 131'. In such cases, the second spacer and the spacer 131' may be made of different materials.

In FIG. 1L, a first dielectric layer 135 is deposited on the etch stop layer 119 to cover the spacer 131' and the top electrodes 130TE, in accordance with some embodiments. The first dielectric layer 135 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than that of silicon dioxide), and may be deposited by spin-on, CVD, FCVD, PECVD, PVD, or any suitable deposition technique. In some embodiments, the deposited first dielectric layer 135 has a thickness in a range of about 800 Å to about 1200 Å.

In FIG. 1M, a chemical mechanical polishing (CMP) method and/or an etch-back process is performed on the deposited first dielectric layer 135 such that top surfaces of the top electrodes 130TE and the spacers 131' are exposed, in accordance with some embodiments. After the CMP and/or etch back process, the top surfaces of the top electrodes 130TE, the spacers 131', and the first dielectric layer 135 are substantially coplanar.

Next, a patterned etch stop layer 137 is selectively deposited on the first dielectric layer 135 and the spacers 131' by, for example, a dielectric on dielectric (DoD) process, in accordance with some embodiments. The patterned etch stop layer 137 may be a high electrical resistant material or a high-k material. Suitable materials may include, but are not limited to, aluminum oxide (AlOx or $Al_2O_3$), aluminum oxynitride (AlON), titanium oxide ($TiO_2$), zirconium oxide ($ZrO_2$), hafnium oxide ($HfO_2$), or other suitable metal oxides. The patterned etch stop layer 137 may be deposited using ALD, CVD, or other suitable process. In some embodiments, the surfaces of the top electrodes 130TE are chemically modified with self-assembled monolayers (SAMs), and then the patterned etch stop layer 137 is deposited on the first dielectric layer 135 and the spacers 131' using an ALD process. The SAMs are used as a blocking layer on the top electrodes 130TE and may be organic SAMs such as alkanethiol, alkylphosphonic acid or a combination thereof. Afterwards, the SAMs are stripped from the surfaces of the top electrodes 130TE. In some embodiments, the patterned etch stop layer 137 has a thickness in a range from about 10 Å to about 50 Å.

In FIG. 1N, a second dielectric layer 139 is deposited on the patterned etch stop layer 137 and the top electrodes 130TE, in accordance with some embodiments. After the formation of the second dielectric layer 139, a patterned photoresist (not shown) is formed on the second dielectric layer 139 by a photolithography process. The patterned photoresist has multiple openings that are aligned with the top electrodes 130TE. The second dielectric layer 139 has an etching selectivity to the patterned etch stop layer 137. The second dielectric layer 139 is etched to form via openings 145 using the patterned photoresist as an etch mask. The via openings 145 are formed to extend through the second dielectric layer 139 and expose at least portions of the respective top electrodes 130TE. In some embodiments, a portion of the patterned etch stop layer 137 is also exposed through the via openings 145. In any case, the patterned etch stop layer 137 covering the spacers 131' can prevent the patterned MTJ structures 120MTJ from damaging during the etching process of forming the via openings 145. The material of the second dielectric layer 139 may be the same as or different from the material of the first dielectric layer 135. In some embodiments, the second dielectric layer 139 has a thickness in a range from about 200 Å to about 800 Å.

In FIG. 1O, a conductive material layer 149 is deposited on the second dielectric layer 139 and to fill the via openings 145 (FIG. 1N), in accordance with some embodiments. The conductive material layer 149 may include or be made of metal, metal alloy, metal nitride, or a combination thereof. Suitable materials for the conductive material layer 149 may include, but are not limited to, TiN, Ta, Cu, TaN, Ti, Co, W, Al, Au, AlCu, or other suitable conductive materials or layered combination thereof. The conductive material layer 149 may be deposited using PVD, CVD, ALD, or other suitable deposition techniques.

In FIG. 1P, a planarization process, such as a CMP process, is performed on the conductive material layer 149 to remove excess portion of the conductive material layer 149 on the second dielectric layer 139. The planarization process is performed until the top surface of the second dielectric layer 139 is exposed. As a result, multiple top electrode vias 149VA is formed on the respective top electrodes 130TE. In cases where the patterned etch stop layer 137 is exposed (FIG. 1N), the top electrode vias 149VA is also formed on a portion of the patterned etch stop layer 137.

Figure 2:
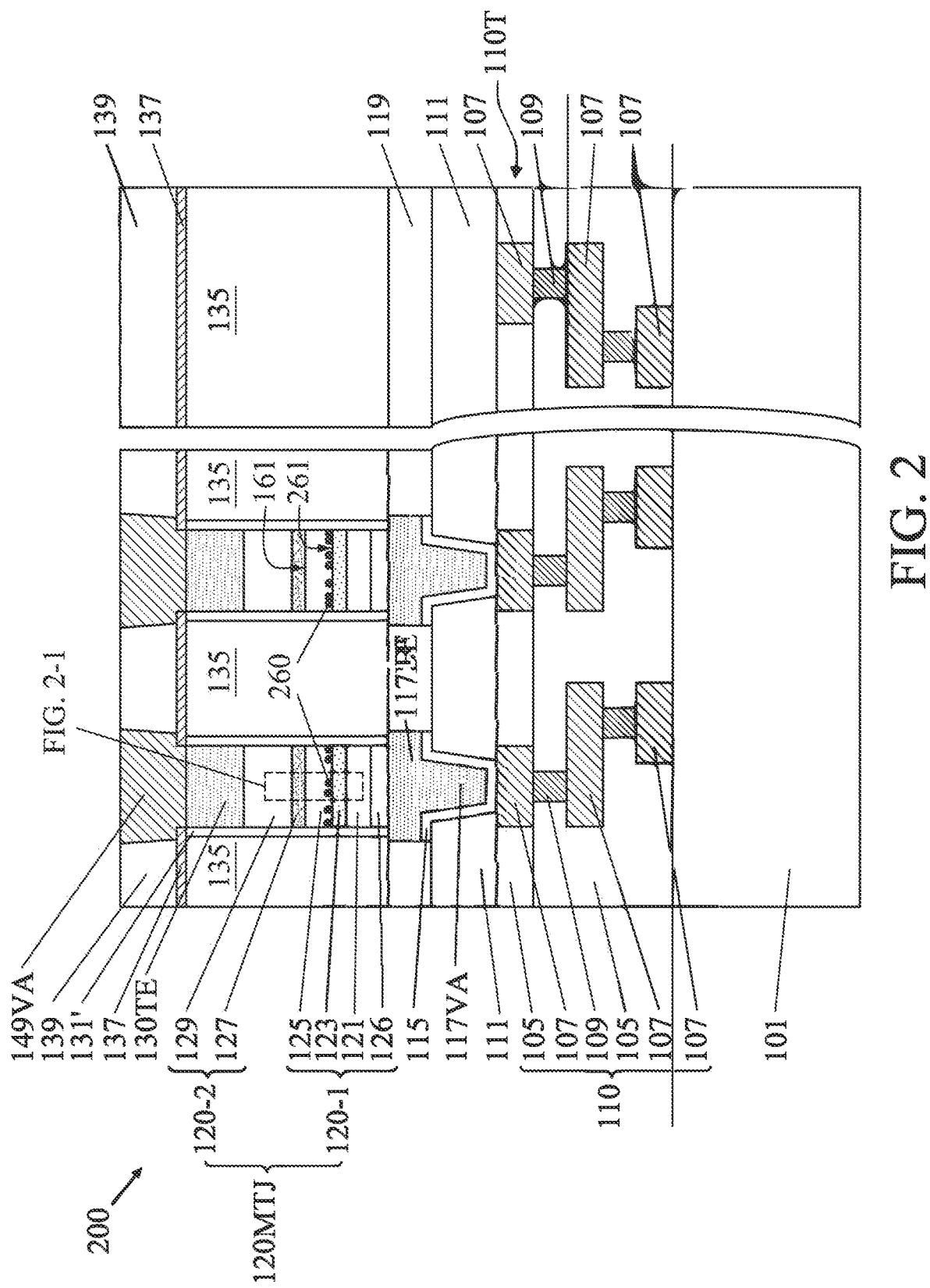
FIG. 2 illustrates a cross-sectional view of an integrated circuit device, in accordance with an alternative embodiment.
Figures 1, 2:
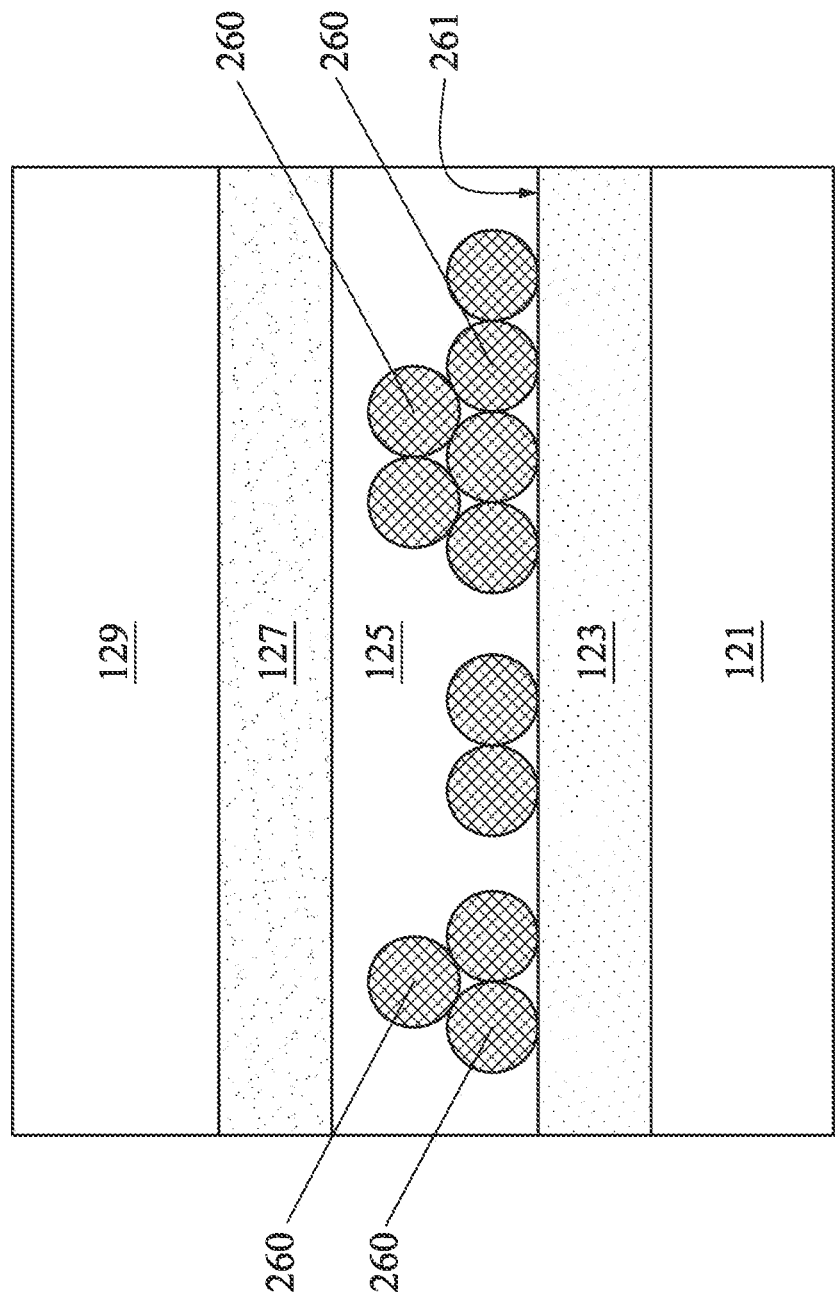

FIG. 2 illustrates a cross-sectional view of an integrated circuit device 200 in accordance with an alternative embodiment. The device 200 is substantially identical to the device 100 of FIG. 1P except that a plurality of metal particles 260, such as the metal particles 160, are disposed on a top surface 261 of the insulating barrier layer 123. Like the metal particles 160, a monolayer of the metal particles 260 is formed in a discrete and non-continuous manner on the insulating barrier layer 123 and encapsulated by the free layer (e.g., second ferromagnetic layer 125) of the patterned MTJ structure 120MTJ. Therefore, the metal particles 260 are inserted between the insulating barrier layer 123 and the Hk enhancing layer 127. In some embodiments, one or more metal particles 260 may be stacked on the monolayer of the plurality of metal particles 260. FIG. 2-1 is an enlarged view a portion of the device 200 shown in FIG. 2 in accordance with some embodiments. As can be seen, the second ferromagnetic layer 125 has a portion in contact with exposed surfaces of the metal particles 260 and a portion in direct contact with the top surface 261 at regions where the metal particles 260 are not present.

While not shown, it is contemplated that the plurality of metal particles 260 may also be disposed on the top surface 261 of the insulating barrier layer 123 and on the top surface 161 of the second ferromagnetic layer 125.

It should be noted that the MTJ structure 120 discussed in this disclosure may be, or part of any type of resistance switching random access memory. Examples of resistance switching random access memory may include, but are not limited to, magneto-resistive random-access memory (MRAM), ferroelectric random access memory (FRAM), carbon nanotube random access memory (NRAM), phase-change memory (PCM), conductive bridging random access memory (CBRAM), oxygen displacement memory (OxRAM), or the like. In addition, while the patterned MTJ structure 120MTJ is shown as being disposed over the uppermost interconnect layer 110T of the interconnect structure 110 in the devices 100, 200, an ordinary skill in the art can understand that the MTJ structure 120 may be located between an $N^{th}$ metal layer (e.g., metal lines 107) and an $(N+1)^{th}$ metal layer, where N is an integer number greater than or equal to 1.

Figure 3:
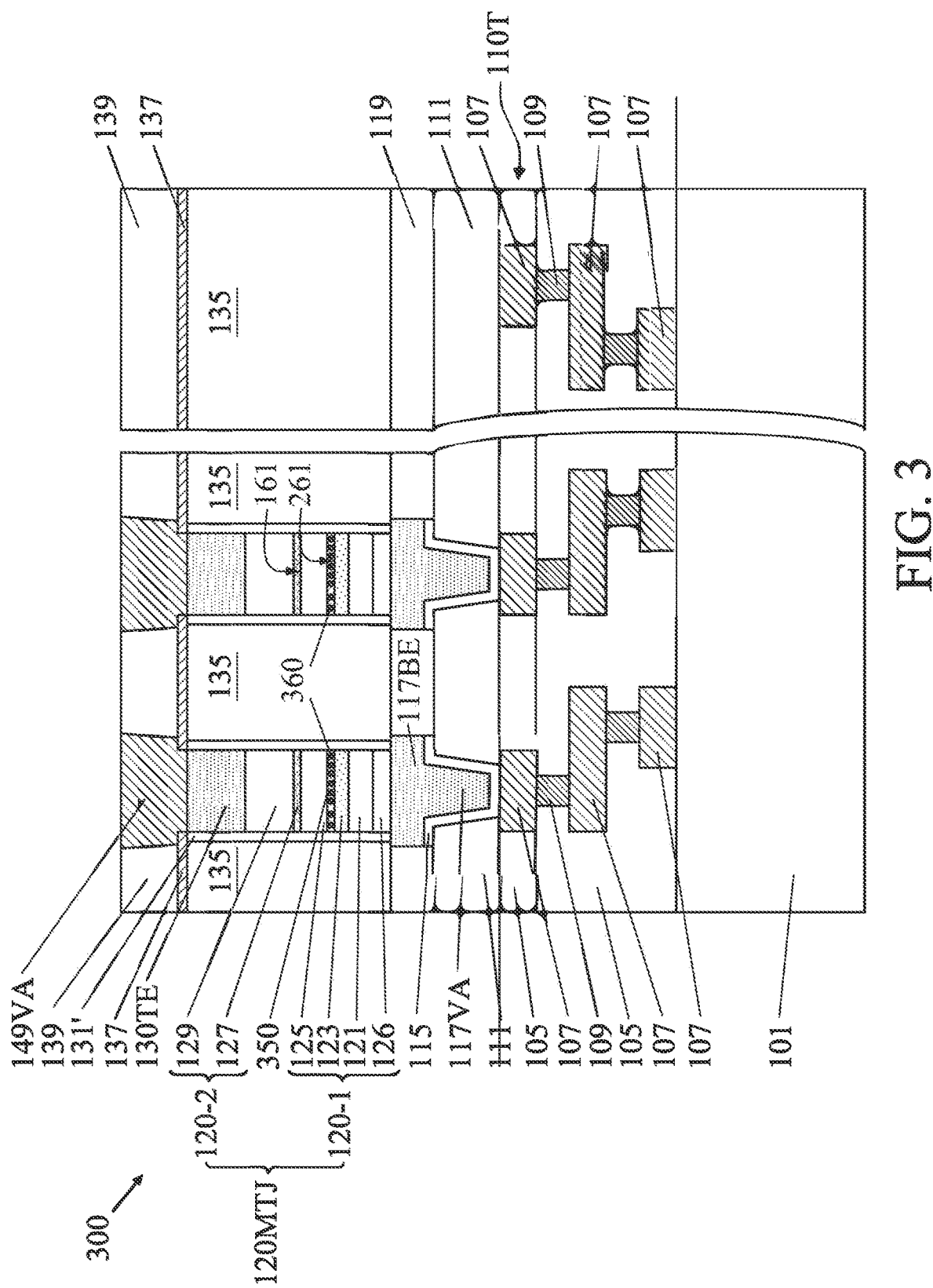
FIG. 3 illustrates a cross-sectional view of an integrated circuit device, in accordance with another alternative embodiment.

FIG. 3 illustrates a cross-sectional view of an integrated circuit device 300 in accordance with another alternative embodiment. The device 300 is substantially identical to the device 100 of FIG. 1P except that an iPMA enhancing layer 350, instead of a plurality of metal particles 160, is formed between the insulating barrier layer 123 and the free layer (e.g., second ferromagnetic layer 125). The iPMA enhancing layer 350 is a continuous layer containing a plurality of metal particles 360. In some embodiments, the iPMA enhancing layer 350 may be deposited in the form of a monolayer of the non-magnetic metal element covering the entire top surface of the insulating barrier layer 123. The metal particles 360 may include or be formed of the same material used for the metal particles 160. The iPMA enhancing layer 350 may have a thickness in a range from about 0.1 Å to about 5 Å.

Figure 4:
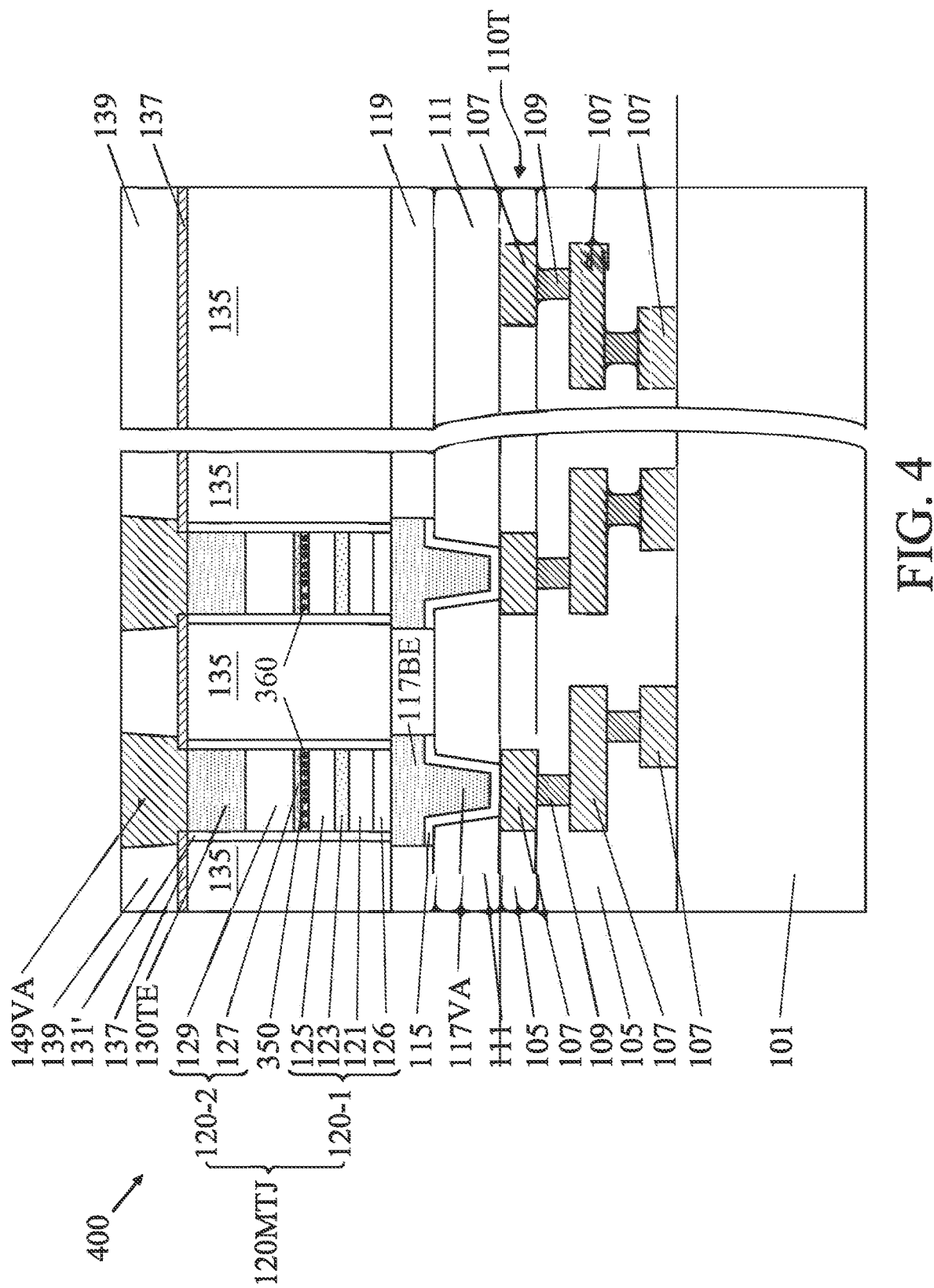
FIG. 4 illustrates a cross-sectional view of an integrated circuit device, in accordance with yet another alternative embodiment.

FIG. 4 illustrates a cross-sectional view of an integrated circuit device 400 in accordance with yet another alternative embodiment. The device 400 is substantially identical to the device 300 of FIG. 3 except that an iPMA enhancing layer 350 is formed between the free layer (e.g., second ferromagnetic layer 125) and the Hk enhancing layer 127. The iPMA enhancing layer 350 is a continuous layer formed of non-magnetic metal material, such as the non-magnetic metal material used for the metal particles 160. In some embodiments, the iPMA enhancing layer 350 is deposited in the form of a monolayer of the non-magnetic metal element covering the entire top surface of the second ferromagnetic layer 125. In some embodiments, the iPMA enhancing layer 350 has a thickness in a range from about 0.1 Å to about 5 Å. While not shown, it is contemplated that the embodiments of FIGS. 3 and 4 may be combined. In such cases, a first iPMA enhancing layer may be provided on the top surface of the second ferromagnetic layer 125 and disposed between the second ferromagnetic layer 125 and the Hk enhancing layer 127, and a second iPMA enhancing layer may be provided on the top surface of the insulating barrier layer 123 and disposed between the insulating barrier layer 123 and the second ferromagnetic layer 125.

Figure 5A:
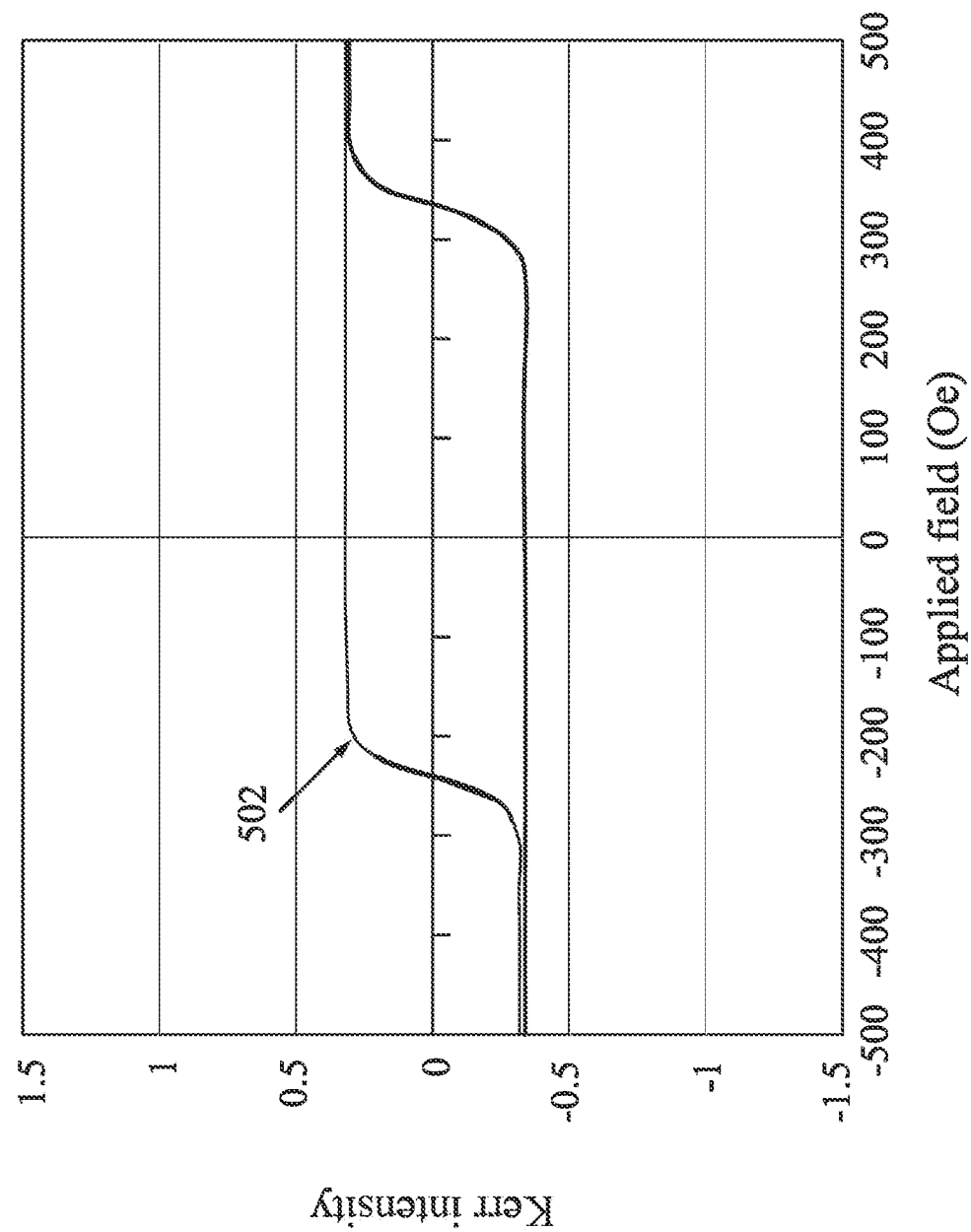
FIGS. 5A-5C illustrate intensity measurements of polar magneto-optical Kerr effect (PMOKE) plotted as a function of applied magnetic field for integrated circuit devices employing an iPMA enhancing layer manufactured in accordance with embodiments of the present disclosure.
Figure 5B:
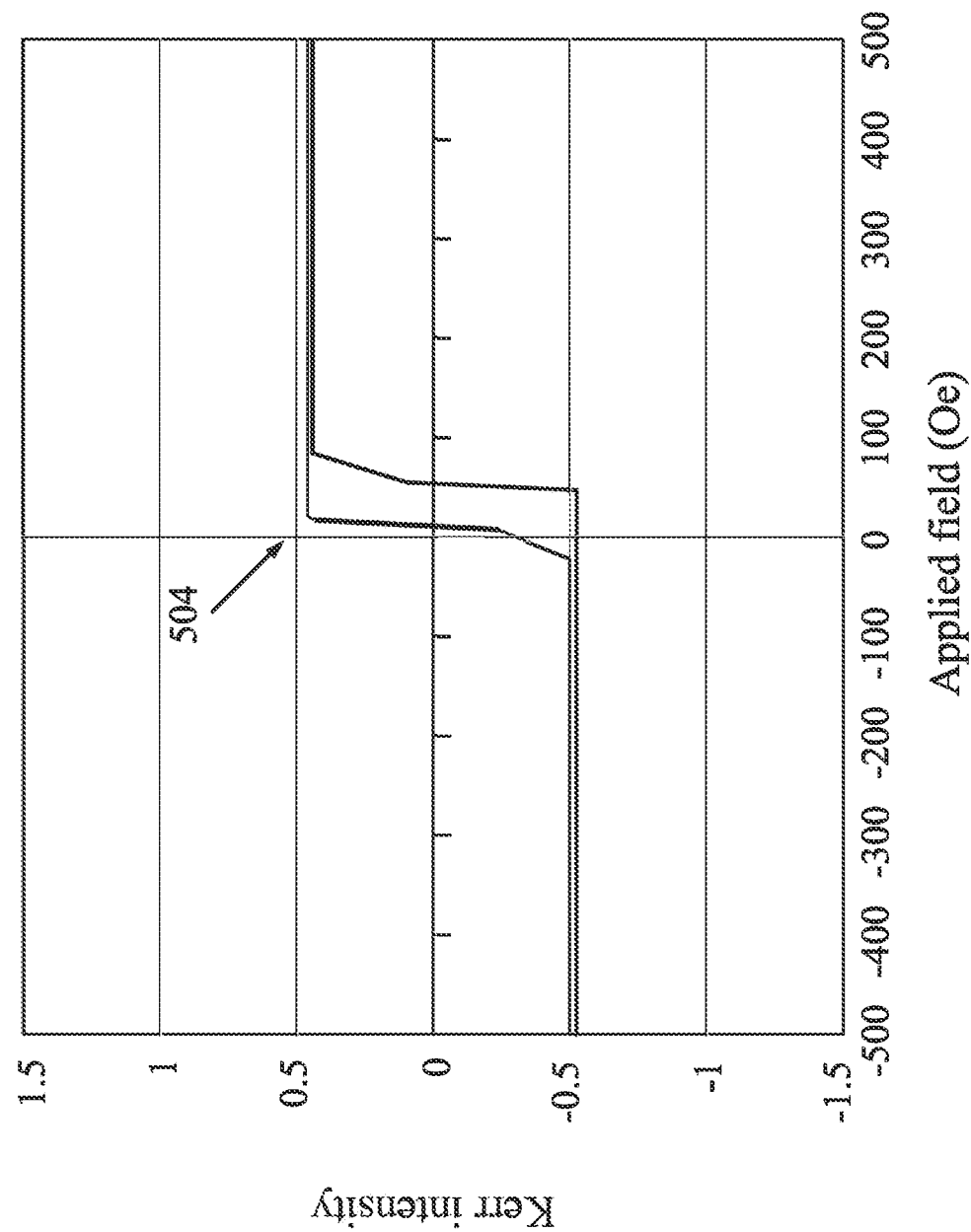
Figure 5C:
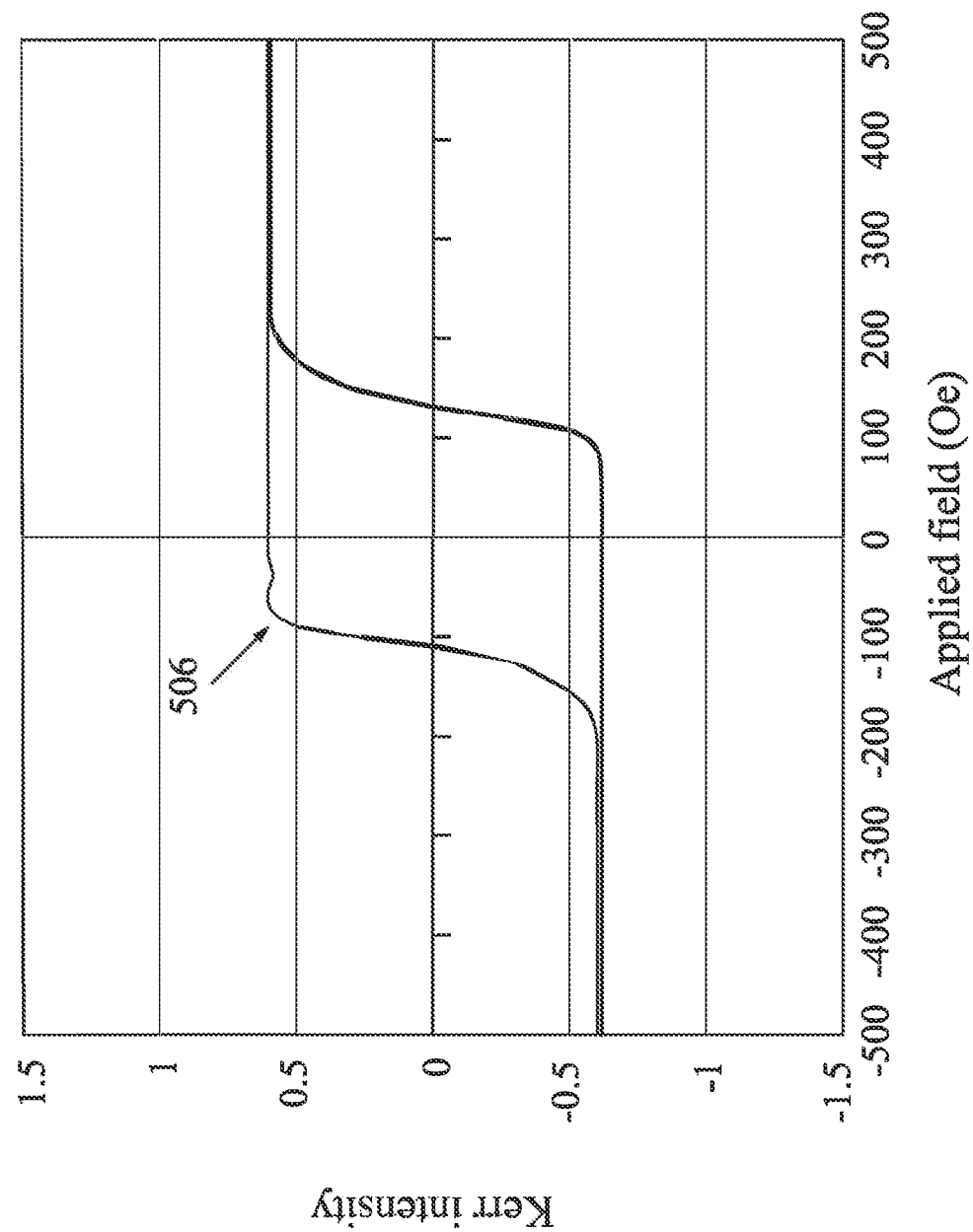

FIGS. 5A-5C illustrate intensity measurements of polar magneto-optical Kerr effect (PMOKE) plotted as a function of applied magnetic field (measured in Oe) for integrated circuit devices (e.g., integrated circuit device 400) employing an iPMA enhancing layer (e.g., iPMA enhancing layer 350) manufactured in accordance with embodiments of the present disclosure. FIG. 5A shows one embodiment in which the iPMA enhancing layer is a continuous layer containing molybdenum (Mo) and disposed between the second ferromagnetic layer 125 and the Hk enhancing layer 127 of the integrated circuit device 400. FIG. 5B shows another embodiment in which the iPMA enhancing layer is a continuous layer of containing tantalum (Ta) and disposed between the second ferromagnetic layer 125 and the Hk enhancing layer 127 of the integrated circuit device 400. FIG. 5C shows yet another embodiment in which the iPMA enhancing layer is a continuous layer containing magnesium (Mg) and disposed between the second ferromagnetic layer 125 and the Hk enhancing layer 127 of the integrated circuit device 400. PMOKE is a non-destructive approach used to assess magnetic properties of materials, and can be represented by a hysteresis loop with different shape, slope, and the squareness ratio (Mr/Ms, where Mr is the remanent magnetization and Ms is the saturation magnetization). Therefore, the polar MOKE hysteresis loops provide the relation between the magnetization and the applied magnetic field. As can be seen in FIGS. 5A-5C, the polar MOKE hysteresis loops 502, 504, 506 each shows a rectangular shape or quasi-square shape with a slope of 0.01 (for iPMA enhancing layer containing Mo), 0.02 (for iPMA enhancing layer containing Mg), and 0.07 (for iPMA enhancing layer containing Ta), respectively, and all polar MOKE hysteresis loops 502, 504, 506 have a squareness ratio (MR/Ms) equal to 1 (meaning the change of magnetization is irreversible even if the applied magnetic field changes from 0 Oe (zero-field) to 500 Oe, for example). The Polar MOKE hysteresis loops 502, 504, 506 thus suggest a strong interfacial perpendicular magnetic anisotropy is derived from the ferromagnetic-dielectric interface (e.g., iPMA enhancing layer 350 and the second ferromagnetic layer 125).

Figure 6:
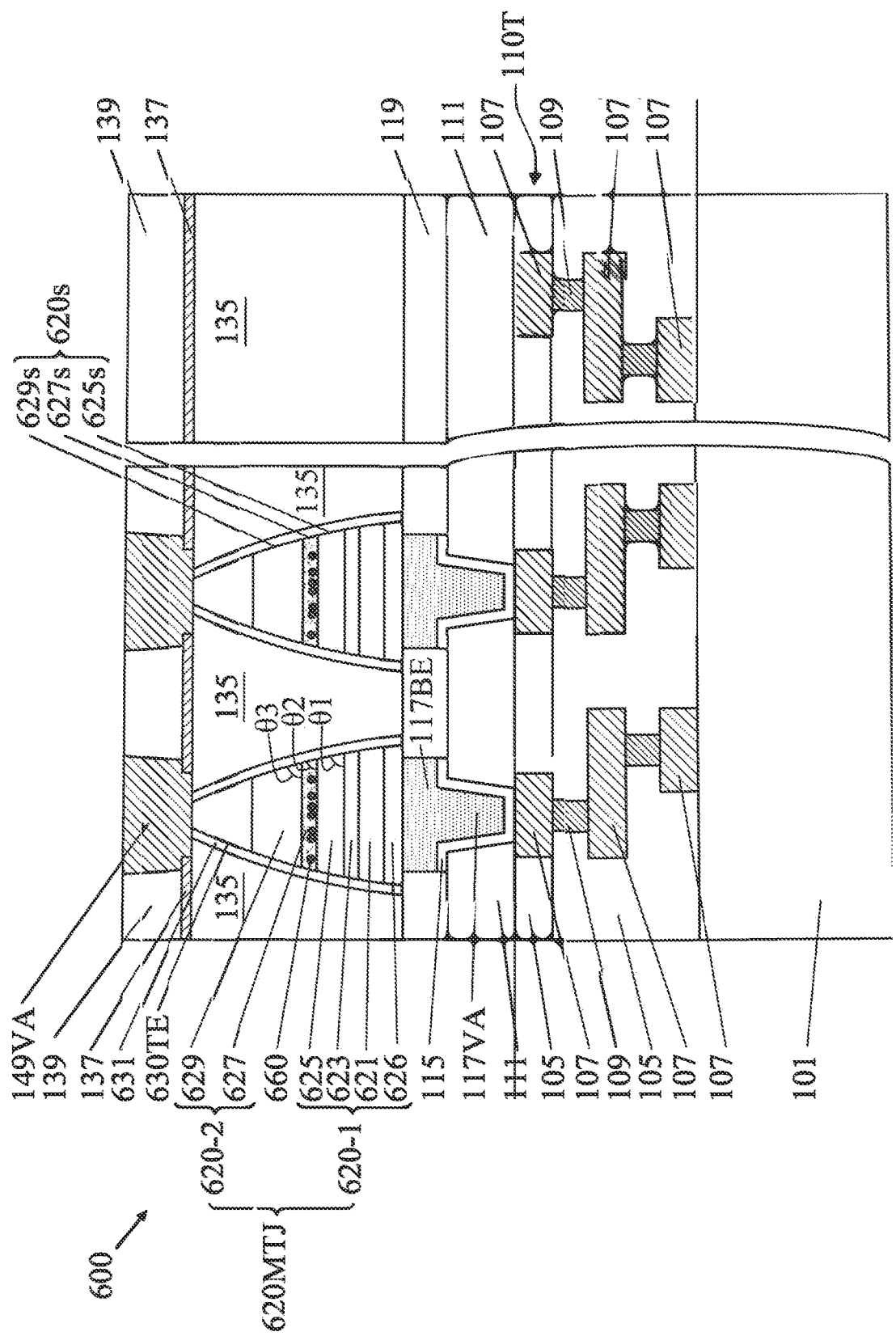
FIG. 6 illustrates a cross-sectional view of an integrated circuit device, in accordance with an alternative embodiment.

FIG. 6 illustrates a cross-sectional view of an integrated circuit device 600, in accordance with an alternative embodiment. In this embodiment, the integrated circuit device 600 is substantially identical to the integrated circuit device 100 shown in FIG. 1P except that the MTJ structures 620MTJ and the top electrodes 630TE are patterned to have a bell-shaped structure with an inclined sidewall relative to a bottom surface of the MTJ structure 620MTJ. The bell-shaped structure of the MTJ structure 620 MTJ and the top electrode 630TE may be formed by photolithography and etching processes after a top electrode 630 (e.g., top electrode 130) is formed on a capping layer 629 (e.g., capping layer 129), such as the manufacturing stage shown in FIG. 1H. The top electrode 630 is then patterned to expose a portion of the capping layer 129. Thereafter, an isotropic physical etching process (e.g., ion bombardment process) may be performed to remove portions of the MTJ structures 620MTJ that are not covered by the top electrode 630. Since the removal rate of the upper portion of the MTJ structures 620MTJ is greater than the removal rate of the lower portion of the MTJ structures 620MTJ, the MTJ structures 620MTJ can be trimmed with multiple inclined sidewall surfaces (collectively referred to as inclined sidewall 620s). For example, a second ferromagnetic layer 625 (e.g., second ferromagnetic layer 125) is trimmed to have a first inclined sidewall 625s having a first angle Θ1 relative to a bottom surface of the second ferromagnetic layer 625, a Hk enhancing layer 627 (e.g., Hk enhancing layer 127) is trimmed to have a second inclined sidewall 627s having a having a first angle Θ2 relative to a bottom surface of the Hk enhancing layer 627, and a capping layer 629 (e.g., capping layer 129) is trimmed to have a third inclined sidewall 629s having a third angle Θ3 relative to a bottom surface of the capping layer 629. In various embodiments, the angle Θ1 of the first inclined sidewall 625s is greater than the angle Θ2 of the second inclined sidewall 627s, and the angle Θ2 of the second inclined sidewall 627s is greater than the angle Θ3 of the third inclined sidewall 629s, namely Θ1>Θ2>Θ3. After the MTJ structures 620MTJ with inclined sidewall 620s are formed, a spacer layer 631 (e.g., spacer layer 131) is conformally deposited on the inclined sidewall 620s of the MTJ structures 620MTJ, followed by the formation of the first dielectric layer 135 as well as various manufacturing processes, as discussed above with respect to FIGS. 1M-1P.

Embodiments of the present disclosure relate to an integrated circuit (IC) device that includes a substrate and an interconnect structure formed over the substrate. The interconnect structure has one or more MRAM devices, each including a perpendicularly magnetic tunnel junction (p-MTJ) structure disposed between a bottom electrode and a top electrode. The p-MTJ structure includes at least a barrier layer sandwiched between a first ferromagnetic layer (e.g., reference layer) and a second ferromagnetic layer (e.g., free layer), a perpendicular anisotropy field (Hk) enhancing layer above the second ferromagnetic layer, and a capping layer above the Hk enhancing layer. The Hk enhancing layer creates ferromagnetic-dielectric interfaces that enhance interfacial perpendicular magnetization anisotropy (iPMA) in the free layer for enhanced data storage. In various embodiments, a plurality of metal particles is discretely disposed at ferromagnetic-dielectric interfaces (e.g., between the second ferromagnetic layer and the capping layer) to provide additional force that boosts iPMA in the free layer. P-MTJ structures formed according to embodiments disclosed herein show increased tunnel magnetoresistance phenomena (TMR) ratio (e.g., over 180%) and reduced resistance-area (RA) product (e.g., 10 Ωμm² or below), thereby enables higher process yields of advanced technology nodes having a critical dimension (CD) less than 28 nm. The p-MTJ structures may be incorporated in all spintronic devices with ferromagnet/dielectric interfaces, such as p-STT MRAM, SOT-MRAM, p-MTJ spin valve devices, or resistance switching random access memory.

In one embodiment, a magnetic tunnel junction (MTJ) structure for storing a data is provided. The MTJ structure includes at least a first ferromagnetic layer having a first surface and a second surface opposing the first surface, a second ferromagnetic layer having a first surface and a second surface opposing the first surface of the second ferromagnetic layer, a first dielectric layer disposed between and in contact with the first surface of the first ferromagnetic layer and the second surface of the second ferromagnetic layer. The MTJ structure also includes a plurality of metal particles arranged on the first surface of the second ferromagnetic layer in a discrete and non-continuous manner, and a second dielectric layer disposed on the plurality of metal particles.

In another embodiment, a magnetic random access memory (MRAM) device is provided. The MRAM device includes a bottom electrode disposed over a semiconductor substrate, a magnetic tunnel junction (MTJ) structure disposed over the bottom electrode, and a top electrode disposed over the MTJ structure. The MTJ structure includes a first ferromagnetic-dielectric interface between a first ferromagnetic layer and an insulating barrier layer, a second ferromagnetic-dielectric interface between a second ferromagnetic layer and a dielectric layer, and an interfacial perpendicular magnetization anisotropy (iPMA) enhancing layer disposed at the second ferromagnetic-dielectric interface.

In yet another embodiment, a method of forming a perpendicular magnetic tunnel junction (p-MTJ) is provided. The method includes forming a first ferromagnetic layer over a substrate, wherein the first ferromagnetic layer has a fixed magnetization oriented in a direction perpendicular to a surface thereof. The method also includes forming an insulating barrier layer on the first ferromagnetic layer and forming a second ferromagnetic layer on the insulating barrier layer, wherein the second ferromagnetic layer has a magnetization that is switchable between a parallel direction and an anti-parallel direction with respect to the fixed magnetization of the first ferromagnetic layer. The method further includes providing a plurality of metal particles on the second ferromagnetic layer and forming a dielectric layer on the plurality of metal particles such that at least one or more metal particles of the plurality of metal particles are embedded in the dielectric layer.

In one embodiment, a magnetic tunnel junction (MTJ) structure is provided. The MJT structure includes a first ferromagnetic layer, a second ferromagnetic layer disposed above the first ferromagnetic layer, a first dielectric layer disposed between and in contact with the first ferromagnetic layer and the second ferromagnetic layer, a plurality of metal particles disposed in contact with the second ferromagnetic layer, wherein the metal particles are distributed in a discrete and non-continuous manner, and a second dielectric layer disposed over the plurality of metal particles.

In another embodiment, a magnetic random-access memory (MRAM) device is provided. The MRAM device includes a bottom electrode disposed over a semiconductor substrate, a magnetic tunnel junction (MTJ) structure, and a top electrode disposed over the MTJ structure. The MTJ structure includes a first ferromagnetic layer disposed over the bottom electrode, an insulating barrier layer disposed over the first ferromagnetic layer, a second ferromagnetic layer disposed over the insulating barrier layer, a dielectric layer disposed over the second ferromagnetic layer, and a first plurality of metal particles embedded within the dielectric layer and discretely disposed on a top surface of the second ferromagnetic layer in a non-continuous manner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of forming a perpendicular magnetic tunnel junction (p-MTJ), comprising:
    forming a first ferromagnetic layer over a substrate, the first ferromagnetic layer having a fixed magnetization oriented in a direction perpendicular to a surface thereof;
    depositing an insulating barrier layer on the first ferromagnetic layer;
    forming a second ferromagnetic layer on the insulating barrier layer, the second ferromagnetic layer having a magnetization that is switchable between a parallel direction and an anti-parallel direction with respect to the fixed magnetization of the first ferromagnetic layer;
    providing a plurality of metal particles on the second ferromagnetic layer, wherein the metal particles are formed of a non-magnetic metal material; and
    forming a dielectric layer on the plurality of metal particles such that at least one or more metal particles of the plurality of metal particles are embedded in the dielectric layer.

2. The method of claim 1, wherein the plurality of metal particles is formed on the second ferromagnetic layer in a discrete and non-continuous manner so that a portion of the dielectric layer is in contact with the the one or more of the plurality of metal particles.

3. A method of forming a perpendicular magnetic tunnel junction (p-MTJ), comprising:
    forming a first ferromagnetic layer over an electrode, the first ferromagnetic layer having a fixed magnetization oriented in a direction perpendicular to a surface thereof;
    forming an insulating barrier layer on the first ferromagnetic layer;
    forming an anti-ferromagnetic layer on the insulating barrier layer;
    forming a second ferromagnetic layer on the anti-ferromagnetic layer, the second ferromagnetic layer having a magnetization that is switchable between a parallel direction and an anti-parallel direction with respect to the fixed magnetization of the first ferromagnetic layer;
    sputtering a plurality of metal particles on the second ferromagnetic layer, wherein the plurality of metal particles is formed of a non-magnetic metal material; and
    forming a dielectric layer on the plurality of metal particles such that the plurality of metal particles are embedded in the dielectric layer.

4. The method of claim 3, wherein the dielectric layer is in contact with the plurality of metal particles and the second ferromagnetic layer.

5. The method of claim 4, wherein the dielectric layer is deposited so that at least two adjacent metal particles of the plurality of metal particles are separated from each other by the dielectric layer.

6. The method of claim 3, wherein the plurality of metal particles comprises molybdenum (Mo), magnesium (Mg), chromium (Cr), ruthenium (Ru), palladium (Pd), tantalum (Ta), titanium (Ti), platinum (Pt), tungsten (W), zirconium (Zr), hafnium (Hf), yttrium (Y), rhodium (Rh), or the like, or any combination thereof.

7. The method of claim 1, wherein the plurality of metal particles comprises molybdenum (Mo), magnesium (Mg), chromium (Cr), ruthenium (Ru), palladium (Pd), tantalum (Ta), titanium (Ti), platinum (Pt), tungsten (W), zirconium (Zr), hafnium (Hf), yttrium (Y), rhodium (Rh), or the like, or any combination thereof.

8. The method of claim 1, wherein the plurality of metal particles is deposited in the form of a monolayer layer.

\* \* \* \* \*